United States Patent
Baniya et al.

(10) Patent No.: US 11,876,303 B2
(45) Date of Patent: Jan. 16, 2024

(54) SWITCHED-BEAM END-FIRE PLANAR ARRAY AND INTEGRATED FEED NETWORK FOR 60-GHZ CHIP-TO-CHIP SPACE-SURFACE WAVE COMMUNICATIONS

(71) Applicant: Arizona Board of Regents on Behalf of the University of Arizona, Tucson, AZ (US)

(72) Inventors: Prabhat Baniya, Tucson, AZ (US); Kathleen L. Melde, Tucson, AZ (US)

(73) Assignee: ARIZONA BOARD OF REGENTS ON BEHALF OF THE UNIVERSITY OF ARIZONA, Tucson, AZ (US)

( * ) Notice: Subject to any disclaimer, the term of this patent is extended or adjusted under 35 U.S.C. 154(b) by 527 days.

(21) Appl. No.: 17/260,808

(22) PCT Filed: Jul. 16, 2019

(86) PCT No.: PCT/US2019/042080
§ 371 (c)(1),
(2) Date: Jan. 15, 2021

(87) PCT Pub. No.: WO2020/018593
PCT Pub. Date: Jan. 23, 2020

(65) Prior Publication Data
US 2021/0296773 A1    Sep. 23, 2021

Related U.S. Application Data

(60) Provisional application No. 62/698,406, filed on Jul. 16, 2018.

(51) Int. Cl.
*H01Q 3/40* (2006.01)
*H01Q 21/06* (2006.01)
(Continued)

(52) U.S. Cl.
CPC ............. *H01Q 3/40* (2013.01); *H01Q 1/2283* (2013.01); *H01Q 21/065* (2013.01);
(Continued)

(58) Field of Classification Search
CPC ............................... H01Q 3/40; H01Q 21/065
See application file for complete search history.

(56) References Cited

U.S. PATENT DOCUMENTS 5,610,617 A * 3/1997 Gans ........................ H01Q 3/24
342/372
6,970,142 B1 * 11/2005 Pleva ................... H01Q 1/3283
343/876
(Continued)

OTHER PUBLICATIONS

Tseng et al., A Low-Cost 60-GHz Switched-Beam Patch Antenna Array With Butler Matrix Network, Jul. 2, 2008 (Jul. 2, 2008); Retrieved from online on Sep. 11, 2019.
(Continued)

*Primary Examiner* — Jason Crawford
(74) *Attorney, Agent, or Firm* — Kaplan Breyer Schwarz, LLP; Stuart H. Mayer

(57) ABSTRACT

A multichip system includes a plurality of processor chips each having one or more cores and a plurality of antenna module for establishing interchip wireless communication. Each antenna module is disposed on a chip. At least one antenna module includes an antenna element array and a Butler matrix. The antenna element array includes n circular patch antenna elements for 360° end-fire scanning, where n is equal to 4 or a multiple thereof. The Butler matrix has n/4 submatrices. Each submatrix include two input 90° hybrids each having two outputs and two inputs for selectively receiving signals from a transceiver. The Butler matrix also includes two output 90° hybrids each having two outputs and two inputs. The two inputs of each output 90° hybrid are coupled to an output of different ones of the input 90°

(Continued)

hybrids. Each output of the output 90° hybrids are coupled to a different antenna element.

22 Claims, 17 Drawing Sheets

(51) Int. Cl.
  *H01Q 1/22* (2006.01)
  *H05K 1/02* (2006.01)
  *H05K 1/18* (2006.01)
  *H01Q 1/38* (2006.01)
(52) U.S. Cl.
  CPC ........... *H05K 1/0243* (2013.01); *H05K 1/181* (2013.01); *H01Q 1/38* (2013.01); *H05K 2201/10098* (2013.01)

(56) References Cited

U.S. PATENT DOCUMENTS

| | | | | |
|---|---|---|---|---|
| 7,183,995 | B2* | 2/2007 | Pleva | G01S 7/352 |
| | | | | 342/374 |
| 8,897,697 | B1 | 11/2014 | Bennett et al. | |
| 9,692,126 | B2* | 6/2017 | Sharawi | H01Q 21/0006 |
| 10,879,627 | B1* | 12/2020 | Frigon | H01Q 21/08 |
| 2003/0098816 | A1* | 5/2003 | Pleva | G01S 7/032 |
| | | | | 343/876 |
| 2010/0225539 | A1* | 9/2010 | Margomenos | G01S 7/032 |
| | | | | 342/373 |
| 2014/0127989 | A1 | 5/2014 | Andrew | |
| 2020/0313294 | A1* | 10/2020 | Morita | H01Q 21/0025 |
| 2020/0395674 | A1* | 12/2020 | Shen | H01Q 1/246 |
| 2021/0296773 | A1* | 9/2021 | Baniya | H05K 1/0243 |
| 2022/0320730 | A1* | 10/2022 | Morita | H01Q 21/065 |

OTHER PUBLICATIONS

Baniya et al., Chip-to-chip switched beam 60 GHz circular patch planar antenna array and pattern considerations, Feb. 7, 2018 (Feb. 7, 2018), [Retrieved from online on Sep. 11, 2019 (Sep. 11, 2019)].
Baniya P. et al. Switched-Beam Endfire Planar Array with Integrated 2-D Butler Matrix for 60 GHz Chip-to-Chip Space-Surface Wave Communications, [Retrieved from online on Sep. 11, 2019 (Sep. 11, 2019)].
A. Karkar, T. Mak, K. F. Tong, and A. Yakovlev, "A survey of emerging interconnects for on-chip efficient multicast and broadcast in many-cores," IEEE Circuits Syst. Mag., vol. 16, No. 1, pp. 58-72, 2016.
N. H. E. Weste, and D. M. Harris, CMOS VLSI Design: A Circuits and Systems Perspective, 4th ed. Boston, MA, USA: Addison-Wesley, 2011.
L. P. Carloni, P. Pande, and Y. Xie, "Networks-on-chip in emerging interconnect paradigms: Advantages and challenges," in 2009 3rd ACM/IEEE Int. Symp. NoC, San Diego, CA, 2009, pp. 93-102.
L. Benini, and G. D. Micheli, "Networks on chips: A new SoC paradigm," Computer, vol. 35, No. 1, pp. 70-78, Jan. 2002.
H.-H. Yeh, N. Hiramatsu, and K. L. Melde, "The design of broadband 60 GHz AMC antenna in multi-chip RF data transmission," IEEE Trans. Antennas Propag., vol. 61, No. 4, pp. 1623-1630, Apr. 2013.
Z. N. Chen, D. Liu, H. Nakano, X. Qing, and T. Zwick, Handbook of Antenna Technologies, vol. 1. Singapore: Springer Nature, 2016.
K. Okada et al., "Full four-channel 6.3-Gb/s 60-GHz CMOS transceiver with low-power analog and digital baseband circuitry," IEEE J. Solid-State Circuits, vol. 48, No. 1, pp. 46-65, Jan. 2013.
G. M. Rebeiz, RF MEMS Theory, Design, and Technology. New York: Wiley, 2002.
P. Baniya, S. Yoo, K. L. Melde, A. Bisognin, and C. Luxey, "Switched-beam 60-GHz four-element array for multichip multicore system," IEEE Trans. Compon. Packag. Manuf. Technol., accepted for publication.
G.H. Huff, J. Feng, S. Zhang, and J. T. Bernhard, "A novel radiation pattern and frequency reconfigurable single turn square spiral microstrip antenna," IEEE Microw. Compon. Lett., vol. 13, No. 2, pp. 57-59, Feb. 2003.
D. Rodrigo, Y. Damgaci, N. Biyikli, B. A. Cetiner, J. Romeu, and L. Jofre, "MEMS-reconfigurable antenna based on a multi-size pixelled geometry," in Proc. 4th Eur. Conf. Antennas Propag. (EuCAP), Barcelona, Spain, 2010, pp. 1-4.
C. H. Tseng, C. J. Chen, and T. H. Chu, "A low-cost 60-GHz switched-beam patch antenna array with Butler matrix network," IEEE Antennas Wireless Propag. Lett., vol. 7, pp. 432-435, 2008.
C. C. Kuo, H. C. Lu, P. A. Lin, C. F. Tai, Y. M. Hsin, and H. Wang, "A fully SiP integrated V-band Butler matrix end-fire beam-switching transmitter using flip-chip assembled CMOS chips on LTCC," IEEE Trans. Microw. Theory Techn., vol. 60, No. 5, pp. 1424-1436, May 2012.
D. Titz, F. Ferrero, C. Luxey, G. Jacquemod, C. Laporte, and H. Ezzeddine, "Design of a miniaturized Butler matrix in IPD process for 60 GHz switched-beam antenna arrays," in Proc. 2012 IEEE Int. Symp. Antennas Propag., Chicago, IL, 2012, pp. 1-2.
I. Ju et al., "V-band beam-steering ASK transmitter and receiver using BCB-based system-on-package technology on silicon mother board," IEEE Microw. Compon. Lett., vol. 21, No. 11, pp. 619-621, Nov. 2011.
S. Lee et al., "A V-Band beam-steering antenna on a thin-film substrate with a flip-chip interconnection," IEEE Microw. Compon. Lett., vol. 18, No. 4, pp. 287-289, Apr. 2008.
W. Lee, J. Kim, C. S. Cho, and Y. J. Yoon, "Beamforming lens antenna on a high resistivity silicon wafer for 60 GHz WPAN," IEEE Trans. Antennas Propag., vol. 58, No. 3, pp. 706-713, Mar. 2010.
Y. Li and K. M. Luk, "60-GHz dual-polarized two-dimensional switch-beam wideband antenna array of aperture-coupled magneto-electric dipoles," IEEE Trans. Antennas Propag., vol. 64, No. 2, pp. 554-563, Feb. 2016.
H. Zhou, "High performance computing architecture with security," Ph.D. dissertation, Dept. Elect. Comput. Eng., Univ. Arizona, Tucson, AZ, 2015.
Y. Li and K. M. Luk, "A multibeam end-fire magnetoelectric dipole antenna array for millimeter-wave applications," IEEE Trans. Antennas Propag., vol. 64, No. 7, pp. 2894-2904, Jul. 2016.
W. F. Moulder, W. Khalil, and J. L. Volakis, "60-GHz two-dimensionally scanning array employing wideband planar switched beam network," IEEE Antennas Wireless Propag. Lett., vol. 9, pp. 818-821, 2010.
D. M. Pozar, Microwave Engineering, 4th ed. Hoboken, NJ, USA: Wiley, 2012.
P. Ioannides, and C. A. Balanis, "Uniform circular arrays for smart antennas," IEEE Antennas Propag. Mag., vol. 47, No. 4, pp. 192-206, Aug. 2005.
C. A. Balanis, Antenna Theory: Analysis and Design, 3rd ed. Hoboken, NJ, USA: Wiley, 2005.
Rogers RO4400 Series Bondply Data Sheet: RO4450B and RO4450F Bondply, Rogers Corp., Chandler, AZ, USA. [Online]. Available: http://www.rogerscorp.com.
Rogers RO4000 Laminates Data Sheet, Rogers Corp., Chandler, AZ, USA. [Online]. Available: http://www.rogerscorp.com.
S. Liao, and Q. Xue, "Dual polarized planar aperture antenna on LTCC for 60-GHz Antenna-in-Package applications," IEEE Trans. Antennas Propag., vol. 65, No. 1, pp. 63-70, Jan. 2017.
D. G. Kam, D. Liu, A. Natarajan, S. K. Reynolds, and B. A. Floyd, "Organic packages with embedded phased-array antennas for 60-GHz wireless chipsets," IEEE Trans. Compon. Packag. Manuf. Technol., vol. 1, No. 11, pp. 1806-1814, Nov. 2011.
W. Hong, K.-H. Baek, and A. Goudelev, "Grid assembly-free 60-GHz antenna module embedded in FR-4 transceiver carrier board," IEEE Trans. Antennas Propag., vol. 61, No. 4, pp. 1573-1580, Apr. 2013.
D. Liu, J. A. G. Akkermans, H. C. Chen, and B. Floyd, "Packages with integrated 60-GHz aperture-coupled patch antennas," IEEE Trans. Antennas Propag., vol. 59, No. 10, pp. 3607-3616, Oct. 2011.

(56) References Cited

OTHER PUBLICATIONS

S.-S. Hsu, K.-C. Wei, C.-Y. Hsu, and H. Ru-Chuang, "A 60-GHz millimeter-wave CPW-fed Yagi antenna fabricated by using 0.18-μm CMOS technology," IEEE Electron Device Lett., vol. 29, No. 6, pp. 625-627, Jun. 2008.

W. Hong, A. Goudelev, K. h. Baek, V. Arkhipenkov, J. Lee, and J. Jung, "Monolithic circular stacked antenna array using high-volume LTCC technology for 60 GHz," in Proc. 2011 IEEE Int. Symp. Antennas Propag., Spokane, WA, 2011, pp. 2032-2034.

D. Liu, and Y. P. Zhang, "Integration of array antennas in chip package for 60-GHz Radios," Proc. IEEE, vol. 100, No. 7, pp. 2364-2371, Jul. 2012.

P. Baniya, A. Bisognin, K. L. Melde, and C. Luxey, "Impact of gain and polarization in the design of reconfigurable chip-to-chip antennas," in Proc. 10th Eur. Conf. Antennas Propag. (EuCAP), Davos, Switzerland, 2016, pp. 1-4.

H.-H. Yeh, and K. L. Melde, "Development of 60-GHz wireless interconnects for interchip data transmission," IEEE Trans. Compon. Packag. Manuf. Technol., vol. 3, No. 11, pp. 1946-1952, Nov. 2013.

J. Warnock, Y.-H. Chan, S. Carey, H. Wen, P. Meaney, G. Gerwig, H. H. Smith, Y. Chan, J. Davis, P. Bunce, A. Pelella, D. Rodko, P. Patel, T. Strach, D. Malone, and F. Malgioglio, "Circuit and physical design implementation of the microprocessor chip for the zEnterprise system," IEEE J. Solid-State Circuits, vol. 47, No. 1, pp. 151-163, Jan. 2012.

D. Titz, F. Ferrero, and C. Luxey, "Development of a millimeter-wave measurement setup and dedicated techniques to characterize the matching and radiation performance of probe-fed antennas [Measurements Corner]," IEEE Antennas Propag. Mag., vol. 54, No. 4, pp. 188-203, Aug. 2012.

C. W. Byeon, C. H. Yoon, and C. S. Park, "A 67-mW 10.7-Gb/s 60-GHz OOK CMOS transceiver for short-range wireless communications," IEEE Trans. Microw. Theory Techn., vol. 61, No. 9, pp. 3391-3401, Sep. 2013.

M. A. Khayat, J. T. Williams, D. R. Jackson, and S. A. Long, "Mutual coupling between reduced surface-wave microstrip antennas," IEEE Trans. Antennas Propag., vol. 48, No. 10, pp. 1581-1593, Oct. 2000.

C. Wang, E. Li, and D. Sievenpiper, "Surface-wave coupling and antenna properties in two dimensions," IEEE Trans. Antennas Propag., vol. 65, No. 10, pp. 5052-5060, Oct. 2017.

P. Baniya and K. L. Melde, "Link characteristics of directional surface wave antenna arrays," in Proc. 12th Eur. Conf. Antennas Propag. (EuCAP), London, UK, 2018, to be published.

P. Baniya and K. L. Melde, "Standing wave considerations in the link model of 60 GHz directional surface wave antenna arrays," in Proc. 2018 IEEE Int. Symp. Antennas Propag., Boston, MA, 2018, to be published.

\* cited by examiner

SWITCHED-BEAM END-FIRE PLANAR ARRAY AND INTEGRATED FEED NETWORK FOR 60-GHZ CHIP-TO-CHIP SPACE-SURFACE WAVE COMMUNICATIONS

GOVERNMENT FUNDING

This invention was made with government support under Grant Nos. 1027703 and 1708458, awarded by NSF. The government has certain rights in the invention.

BACKGROUND

Reconfigurable interchip communication in multicore multichip (MCMC) computing systems can be achieved through the use of millimeter wave (mmW) switched-beam antenna arrays connected to CMOS chip routers. Traditionally, the antennas have been used to enable wireless interconnection between the chips to solve the wiring complexity problem in such systems. Such communication systems are shown, for example, in P. Baniya et al., "Chip-to-chip switched beam 60 GHz circular patch planar antenna array and pattern considerations," *IEEE Trans. Antennas Propag.*, vol. 66, no. 4, pp. 1776-1787, April 2018 and A. Karkar, "A survey of emerging interconnects for on-chip efficient multicast and broadcast in many-cores," *IEEE Circuits Syst. Mag.*, vol. 16, no. 1, pp. 58-72, 2016. The use of such interchip links in MCMC systems can result in significantly lower power dissipation and delays since long wired interconnects are avoided, allowing more chips to be linked and placed in a computing module. The proper operation of the module is ensured at the network level through the use of network-on-chip (NoC) techniques.

Antenna arrays play a crucial role in determining the performance of the wireless and the hybrid interchip communication links. In addition to having a broad bandwidth, a switchable main beam, a small footprint, and high radiation efficiency, the antenna arrays should have seamless connectivity with the transceivers that are integrated on the individual chips.

SUMMARY

In one aspect, an antenna module is provided that includes an antenna element array and a Butler matrix. The antenna element array includes an array of n circular patch antenna elements for 360° end-fire scanning, where n is equal to 4 or a multiple thereof. The Butler matrix has n/4 submatrices. Each of the submatrices include two input 90° hybrids that each have two outputs and two inputs for selectively receiving signals from a transceiver. The Butler matrix also includes two output 90° hybrids each having two outputs and two inputs. The two inputs of each output 90° hybrid are coupled to an output of different ones of the input 90° hybrids. Each output of the output 90° hybrids are coupled to a different one of the circular patch antenna elements.

In another aspect, a multichip system is provided that includes a plurality of processor chips each having one or more processor cores and a plurality of antenna module for establishing interchip wireless communication. Each of the antenna modules are disposed on one of the processor chips. At least one of the antenna modules includes an antenna element array and a Butler matrix. The antenna element array includes an array of n circular patch antenna elements for 360° end-fire scanning, where n is equal to 4 or a multiple thereof. The Butler matrix has n/4 submatrices. Each of the submatrices include two input 90° hybrids that each have two outputs and two inputs for selectively receiving signals from a transceiver. The Butler matrix also includes two output 90° hybrids each having two outputs and two inputs. The two inputs of each output 90° hybrid are coupled to an output of different ones of the input 90° hybrids. Each output of the output 90° hybrids are coupled to a different one of the circular patch antenna elements.

In one particular embodiment, a compact feed network is integrated with a chip-to-chip 60-GHz 2×2 circular patch planar antenna array. In this embodiment the resulting antenna module is a thin multilayer microstrip structure with a footprint small enough to fit over a typical multicore chip. The network enables end-fire (azimuthal) scan of the array main beam in the four diagonal directions. The antenna module provides a seamless and practical way to achieve reconfigurable interchip communication in multicore multichip (MCMC) systems. A hybrid space-surface wave link may also be provided, which takes advantage of surface wave coupling. A 2-D Butler matrix, implemented in microstrip, is used as the feed network for the planar array. The matrix is a four input, four output i.e., 4×4 network that includes four interconnected quadrature (90°) hybrid couplers. A multi-antenna module (MAM) that includes five antenna modules that emulates diagonal interchip communication in MCMC systems has been fabricated. The simulation and measurement of transmission coefficients between the antenna modules on the MAM demonstrate good agreement between the results.

BRIEF DESCRIPTION OF THE DRAWINGS

FIG. 12(a) shows $|S_{CE}|$, FIG. 12(b) shows $|S_{IE}|$, FIG. 12(c) shows $S_{AE}|$ and FIG. 12(d) shows $|S_{GE}|$.

DETAILED DESCRIPTION

Figure 1:
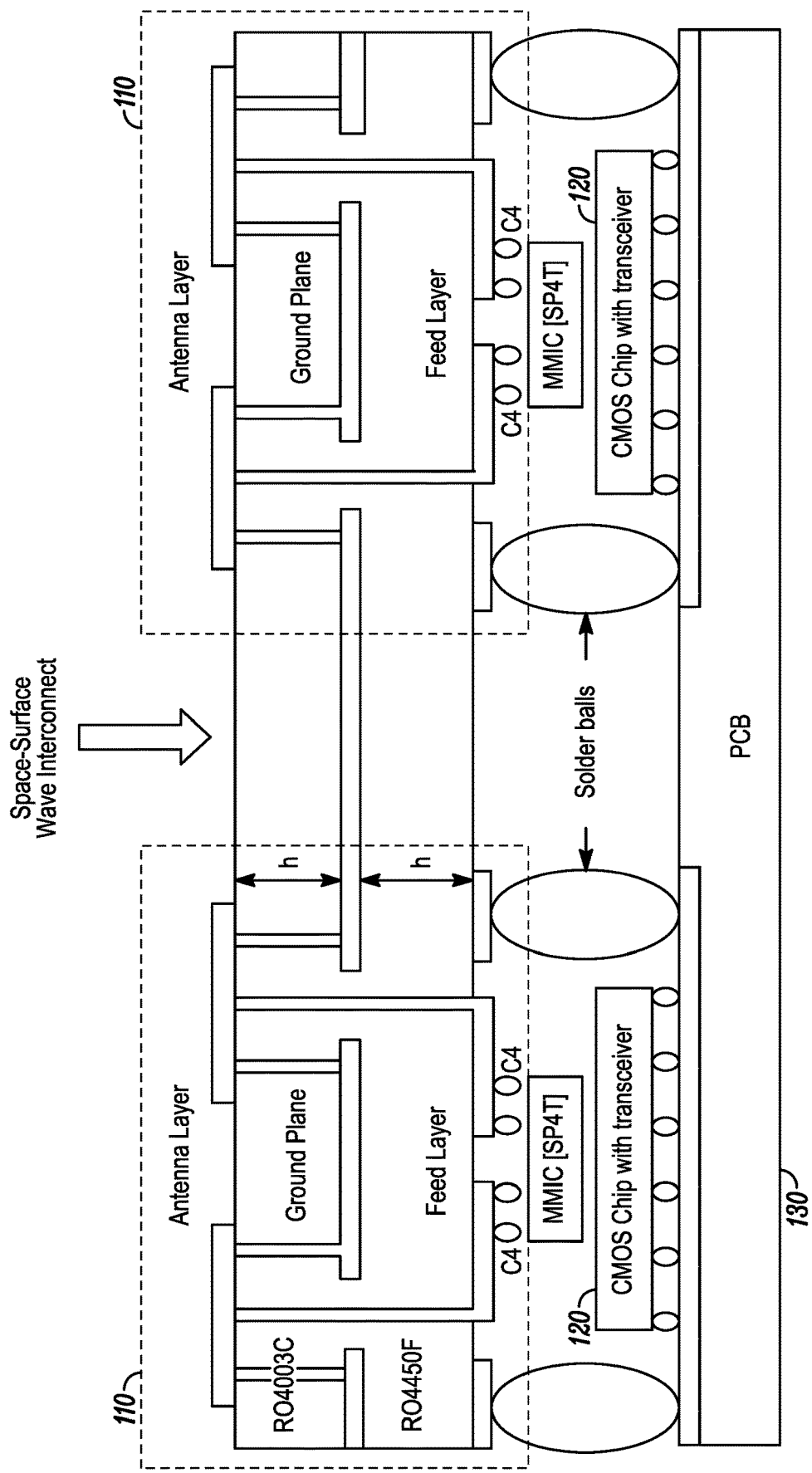
FIG. 1 show one example of a hybrid space-surface wave interconnect for chip-to-chip communications in which a multilayer antenna module is surface mounted on a PCB board over the chips to establish connection therewith.

As explained in more detail below, antennas are provided for establishing interchip space and surface wave communication between processor cores of a multichip system, where each chip may have one or more processor cores. FIG. 1 illustrates this hybrid space-surface wave interconnect concept for chip-to-chip communications operating, for example, at 60-GHz. As shown, each multilayer antenna module 110 can be surface mounted on a printed circuit board (PCB) board 130 over a respective CMOS chip 120 to establish connection. Each CMOS chip 120 has a transceiver integrated therewith, which serialize/deserialize the data to be exchanged, and provide the 60-GHz modulated/demodulated signals for transmission/reception by the antenna. This will minimize the number of connections required between the chip and its respective antenna module 110.

The chips 120 are BGA mounted on the PCB board 130. The antenna modules 110 are then surface mounted on the PCB board over the chips. Alternatively, a double-sided PCB board may be used to mount the antenna modules 110. By matching the layout and arrangement of the antenna modules 110 to the chips 120 underneath, the substrates and ground planes of each antenna module can be connected together to form an interconnect layer parallel to the PCB board/chips and thus take advantage of surface wave coupling in addition to space wave coupling.

Figure 2:
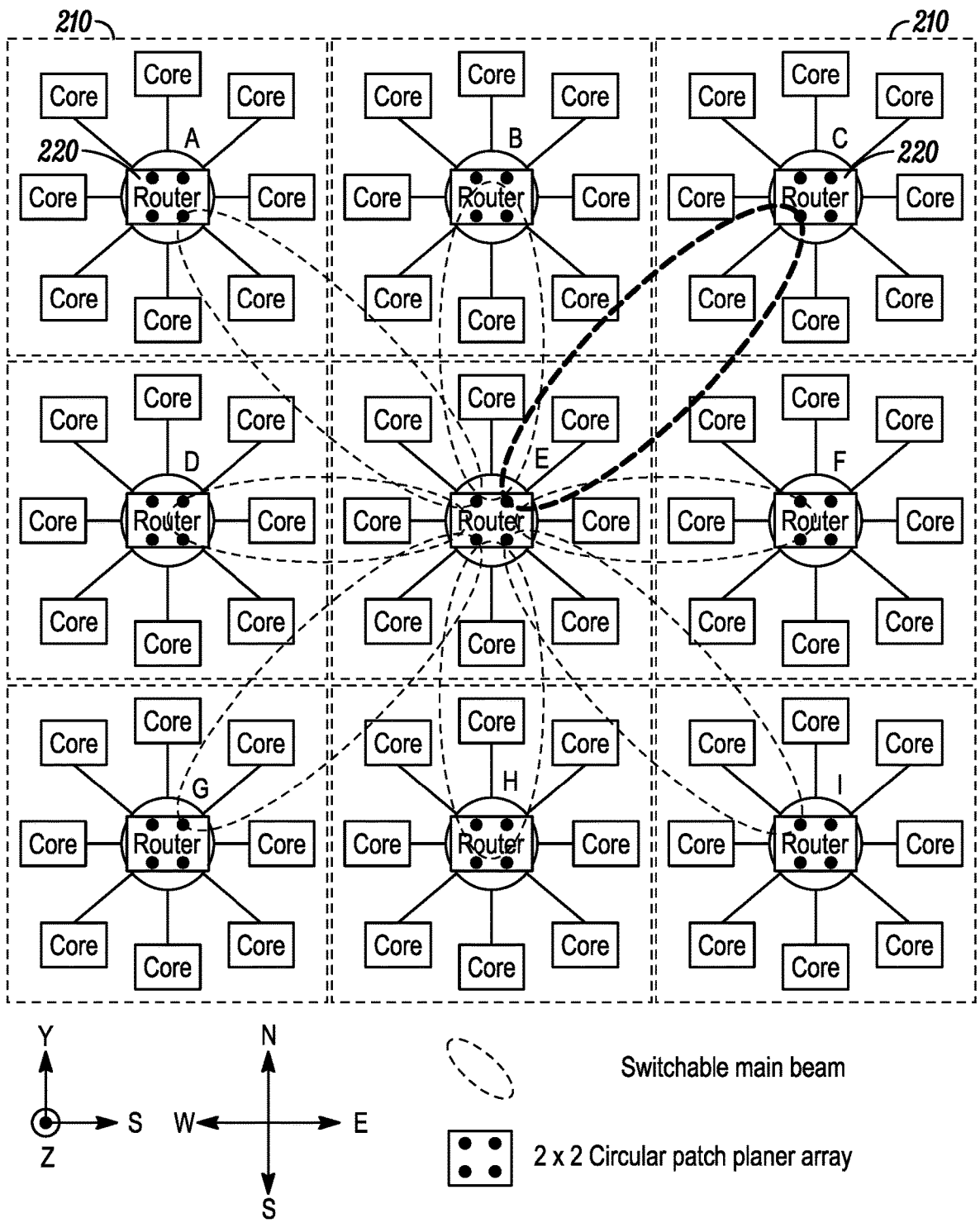
FIG. 2 shows one example of a 3×3 multicore multichip (MCMC) system with each block representing a multicore CMOS chip with the antenna module packaged on top in the manner illustrated in FIG. 1.

This hybrid interconnect concept can be used to develop a massively multicore computing unit that is capable of dynamically reconfiguring the interchip links. FIG. 2 shows one example of a 3×2 multichip multicore (MCMC) system with block 210 representing an individual multicore CMOS chip with the antenna module 220 packaged on top. The antenna modules 220 provide switchable beams in the azimuth plane for reconfigurable interchip communication, as illustrated by the dashed lines in FIG. 2. The surface waves help to increase the power coupling between the chips and improve signal power at large distances.

FIG. 2 depicts how planar arrays can be used in a 3×3 MCMC system for interchip communication. The cores on a chip communicate through short high speed wired links whereas long distance communication between chips is done through the hybrid interconnect layer using the planar arrays. Note that in order for a chip (e.g., chip E in FIG. 2) to communicate to all its eight adjacent neighbors, the array should provide eight beams (360° angular coverage in 45° steps). A planar array with more than four elements may be necessary to get the eight beams. However, as shown below, a simpler beam scanning arrangement in only the diagonal directions with four beams (360° angular coverage in 90° steps) is illustrated below Also illustrated is the manner in which a planar array and the Butler matrix can be augmented to obtain the eight beams. Interchip communication in the diagonal directions can reduce the average hop count and latency in the network. In the MCMC system of FIG. 2, the antenna arrays all lie in the same xy plane, and hence, they must be capable of end-fire scanning. This is unlike broadside scanning in mmW Wi-Fi. Therefore, MCMC systems present a unique challenge of end-fire scanning with 360° angular coverage on the design of the antenna arrays.

Besides a broad bandwidth, the use of a 60 GHz operating frequency offers several other advantages. For instance, atmospheric absorption near 60 GHz provides higher interference suppression at long range that reduces off-system interference to neighboring devices. In addition, the transceivers already developed for 60 GHz WLAN applications and compliant with WiGig IEEE 802.1 lad standard can be utilized. The standard specifies four channels with each channel having 2.16 GHz bandwidth and throughput of up to 7 Gbps. As illustrated in FIG. 1, the antenna array and feed network at 60 GHz can be made small enough to fit over a multicore chip of a typical size [9] with little to no area overhead and ultimately minimize the chip-to-chip distances. The arrays must provide communication over these distances, usually several tens of millimeters, as dictated by the chip/antenna size. Of course, while a 60 GHz operating frequency may be advantageously employed in some embodiments, the present invention contemplates other embodiments that employ alternative operating frequencies.

Beamforming using solid-state phase shifters is not practical at mmW frequencies due to high loss. Pattern reconfiguration at 60 GHz by simply switching array elements on and off has previously been proposed. The loss in the switch network will depend largely on the type and number of switches used. For example, using just one single-pole n-throw (SPnT) switch to feed the array elements can minimize the loss. But this also means only one element can be fed at a time, resulting in lower directivity and gain. Alternatively, the Butler matrix and the Rotman lens have been extensively used as beamforming networks (BFNs) for linear arrays at 60 GHz. One advantage of using BFNs is that all the elements in the array can be fed simultaneously to get high directivity, with a relatively small array footprint. There are, however, increased losses in the BFN. The BFN footprint will also increase the antenna module size. The BFNs still require one single pole, multiple throw (SPnT) switch at the front end which contributes to additional loss.

Figure 3A:
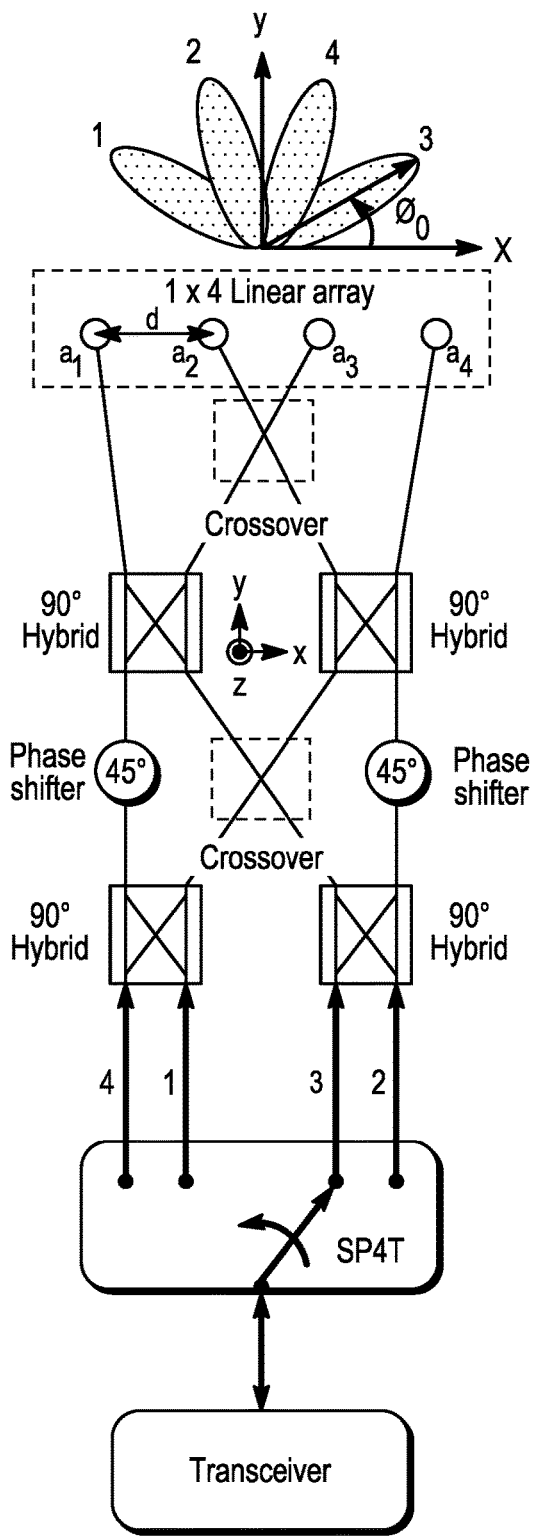
FIG. 3(a) shows a 1-D Butler matrix beamformer for a linear array (180° angular coverage) and FIG. 3(b) show a four input four output (4×4) Butler matrix for use with a 2×2 circular patch planar array to provide four switchable diagonal beams in the azimuth plane.

The scan coverage of an array is determined by the type of the array used. For instance, FIG. 3(a) shows a 1-D Butler matrix beamformer for a linear array (180° angular coverage). The SPOT switch can scan the array main beam by selecting one of the Butler matrix inputs for connection with the transceiver. Thus, the linear array is capable of only 180° scan coverage and uses a traditional (1-D) Butler matrix for beamforming.

Figure 3B:
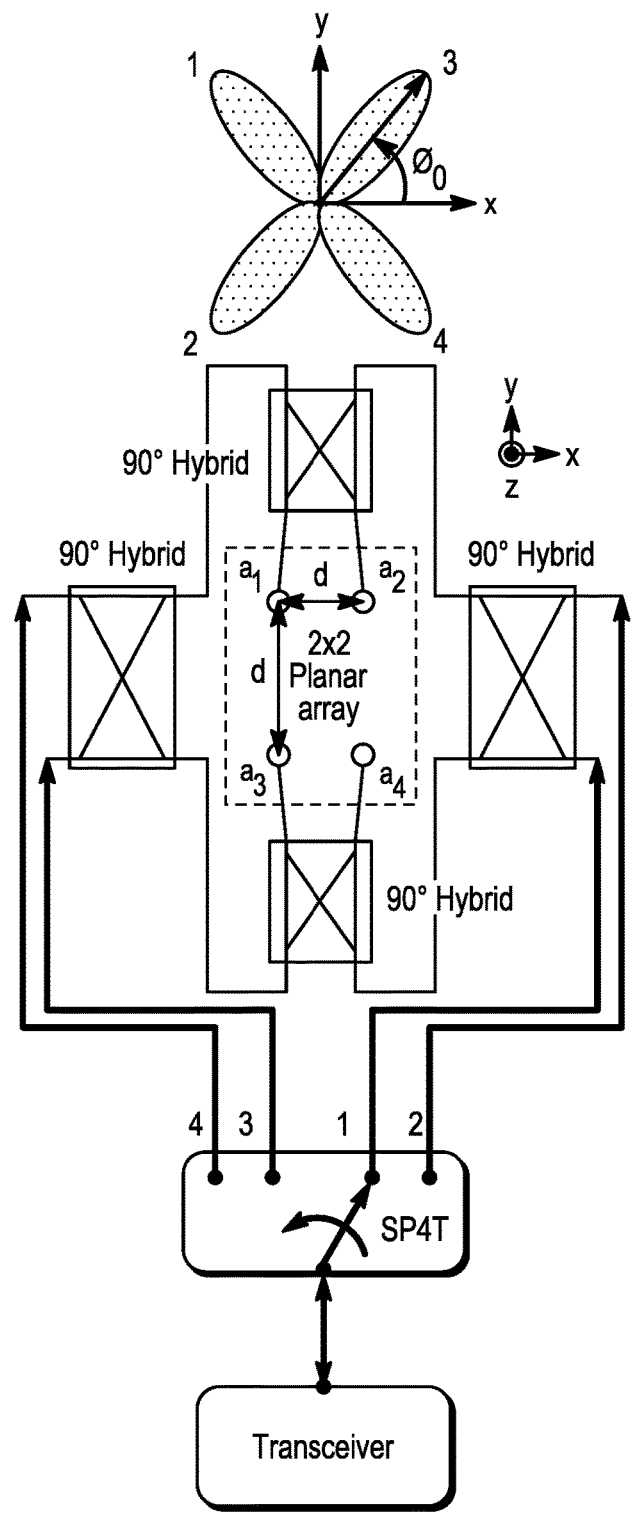

In contrast to the 1-D Butler matrix beamformer shown in FIG. 3(a) that employs a linear array, a planar array can provide 360° scan coverage. Such a 2-D Butler matrix beamformer, shown in FIG. 3(b), is better suited for the chip-to-chip communications envisioned herein as illustrated in FIG. 2. In FIG. 3(b), a four input four output (4×4) Butler matrix is shown for use with a 2×2 circular patch planar array to provide four switchable diagonal beams in the azimuth plane. The Butler matrix provides end-fire scanning (i.e., scanning in the same plane as the antenna elements). A 2×2 planar array is a combination of two linear arrays in the x- and y-directions. Each linear array is fed by a 1-D Butler matrix (which reduces to a coupler for the simplest case of a two-element linear array), which are then interconnected with additional couplers. In that sense, the Butler matrix can be characterized as a 2-D Butler matrix. Additionally, the inputs of the 2-D Butler matrix are isolated from one another and the power is equally divided at the outputs. Thus, the 2-D Butler matrix retains the properties of the 1-D Butler matrix.

An eight beam end-fire scanning array using magneto-electric (ME) dipole elements with the 1-D Butler matrix has been previously demonstrated, but its angular coverage is limited to 180°. A BFN based on the 1-D Butler matrix with stacked-patches that scans in two planes has also been shown, but for broadside scanning. Likewise, a substrate integrated waveguide (SIW) implementation of the 2-D Butler matrix with a ME dipole planar array has been shown, but also for broadside scanning.

In one embodiment, the 2-D Butler matrix may be implemented in a microstrip and may employ circular patch antenna elements to obtain the four diagonal (end-fire) beams. Such a Butler matrix is suitable for diagonal chip-to-chip communications of the type depicted in FIG. 2 since it provides 360° angular coverage in 90° steps in the azimuth plane. As illustrated in FIG. 3(b), the 2-D Butler matrix is augmented with a MMIC single-pole four-throw (SP4T) switch at its input to enable electronic feed line switching. The main beam direction of the array is determined by the input selected. In one embodiment the SP4T switch can be flip-chip (C4) attached to the antenna module, as shown in FIG. 1. The switch that is employed may have attributes such as low loss, low bias and drive voltage, high isolation, high switching speed, and good reliability. Suitable switches may be electronic switches in the form of microelectromechanical system (MEMS), PIN diodes and FETs, for example, which have previously been used for line switching at 60 GHz.

The remainder of this disclosure is organized as follows. Section I illustrates the design of an illustrative 4×4 2-D Butler matrix for a 60 GHz 2×2 planar array. Section II presents the detailed structure of the Butler matrix in a microstrip implementation and a 2×2 circular patch planar array along with the full wave simulation results. Section III presents the stacking and integration of the Butler matrix with the circular patch planar array to realize a multilayer antenna module. Simulation results showing the switching of the array main beam through the individual excitation of the Butler matrix inputs are presented in detail. The gain response of the array is analyzed and the gain bandwidth is defined. Section IV presents the simulated and measured transmission coefficients between the antenna modules in a MCMC scenario. A simulation technique to decompose the total link transmission into space and surface wave components is presented as well. Section V illustrates how eight switched-beams could be attained. Section VI summarizes the results described herein.

I. Butler Matrix for Planar Array

A 2×2 planar array of antenna elements $a_1$, $a_2$, $a_3$ and $a_4$ are shown in FIG. 3(b). The inter-element phase shifts required to have the main beam of the planar array sweep along the four diagonal directions i.e., $\varphi_0 = 45°$, $-45°$, $135°$, and $-135°$ in the azimuth plane ($\theta_0 = 90°$) are given by, $$\beta_x = \beta_{a_{2,1}} = \beta_{a_{4,3}} = -k_0 d_x \cos \varphi_0 \quad (1)$$

$$\beta_y = \beta_{a_{2,4}} = \beta_{a_{1,3}} = -k_0 d_y \sin \varphi_0 \quad (2)$$

where $k_0 = 2\pi/\lambda_0$ is the free space wave number at the wavelength $\lambda_0$, $d_x$ and $d_y$ are the inter-element separations in the x- and y-directions in the azimuth plane, and $\beta_x$ and $\beta_y$ are the inter-element phase shifts in the x- and y-directions respectively. Note that $\beta_x$ represents the phase difference between the elements $a_2$ and $a_1$ i.e., $\beta_{a_{2,1}}$, and between the elements $a_4$ and $a_3$ i.e., $\beta_{a_{4,3}}$, both of which must equal one another. Similarly, $\beta_y$ represents the phase difference between the elements $a_2$ and $a_4$ i.e., $\beta_{a_{2,4}}$, and between the elements $a_1$ and $a_3$ i.e., $\beta_{a_{1,3}}$, both of which must also equal one another.

From (1) and (2), we can see that the main beam can be scanned along the four diagonals $\varphi_0$ if $d_x$ and $d_y$ are set to, $$d_x = d_y = d = 0.35\lambda_0 \quad (3)$$

when, $$|\beta_x| = |\beta_y| = 90° \quad (4)$$

The ±90° value is chosen for $\beta_x$ and $\beta_y$ because it can be easily obtained at the output of the quadrature (90°) hybrid couplers. Another desirable effect of (3) is that the grating lobes are avoided since $d < \lambda_0/2$. Substituting the four different values for $\varphi_0$ in (1) and (2), with (3) satisfied, we get four different combinations of $\beta_x$ and $\beta_y$ which are listed in Table I.

TABLE I

INTER-ELEMENT PHASE SHIFTS REQUIRED FOR MAIN BEAM FORMATION IN THE AZIMUTH PLANE

| Port | $\varphi_0$ | $\beta_x$ | $\beta_y$ |
|---|---|---|---|
| 1 | +135° | +90° | −90° |
| 2 | −135° | +90° | +90° |
| 3 | +45° | −90° | −90° |
| 4 | −45° | −90° | +90° |

Figure 4:
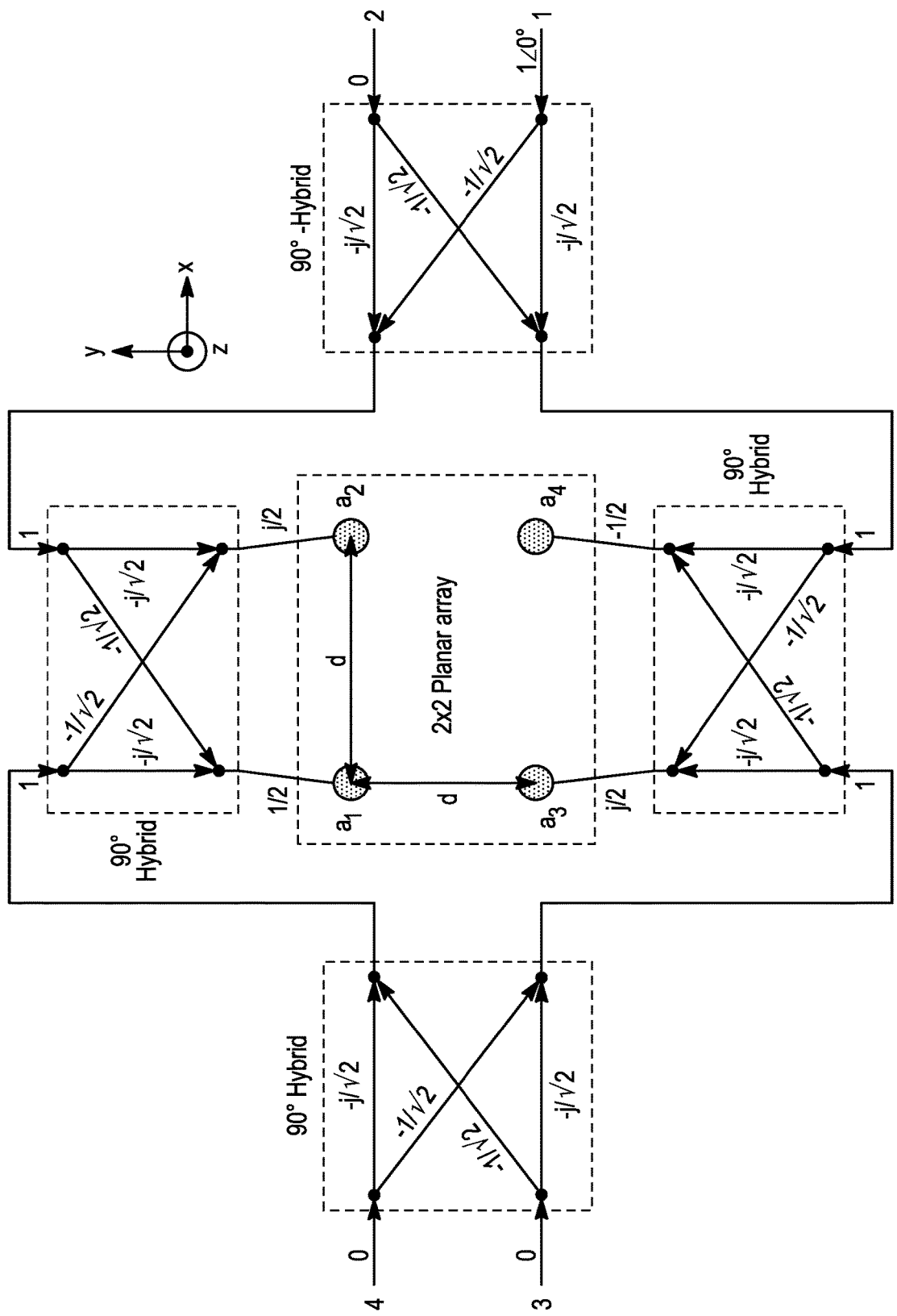
FIG. 4 shows a signal flow graph of the 4×4 2-D Butler matrix showing how $\beta_x=+90°$ and $\beta_y=-90°$ is obtained at the planar array when port 1 is excited.

The 4×4 2-D Butler matrix, as shown in FIG. 3(b), consists of four quadrature (90°) hybrid couplers interconnected in such a way so that a specific phase difference between the signals at the output is obtained for each input excitation. Note that the matrix does not require use of crossovers and 45° phase shifters, unlike that in the 4×4 1-D Butler matrix shown in FIG. 3(a). The four output ports are arranged in a 2×2 grid format to match the layout of the planar array and realize the ±90° phase difference in both the x- and y-directions. In order to understand how the matrix in FIG. 3(b) attains the required phase shifts in Table I, let us consider the case when port 1 is excited. FIG. 4 shows the signal flow graph which is used to describe the flow of signal for port 1 excitation. When port 1 is excited, the two arms of the right coupler in FIG. 4 produce signals $-j/\sqrt{2}$ and $-1/\sqrt{2}$ at the coupler output. The signal $-j/\sqrt{2}$ from the bottom arm is further split by the bottom coupler into signals $-\frac{1}{2}$ at $a_4$ and $j/2$ at $a_3$ while the signal $-1/\sqrt{2}$ from the top arm is further split by the top coupler into signals $j/2$ at $a_2$ and $\frac{1}{2}$ at $a_1$. This effectively achieves $\beta_x = +90°$ and $\beta_y = -90°$ in Table I and produces a main beam along $\varphi_0 = +135°$. Each input port is isolated from the other and there is equal power division at the output ports.

II. Implementation of Butler Matrix and Planar Array

As previously mentioned, in some embodiments the Butler matrix may be implemented in microstrip form for ease of fabrication and measurement. The hybrids are designed first and their S-parameters are verified through full wave simulation. The hybrids are then interconnected and arranged as in FIG. 3(b) to realize the Butler matrix. The matrix may be realized as a feed layer (illustrated in FIG. 1) on a Rogers RO4450F prepreg ($\varepsilon_r=3.52$, tan $\delta=0.004$). The prepreg is stacked and bonded with a Rogers RO4003C dielectric core ($\varepsilon_r=3.55$, tan $\delta=0.0027$). The antenna layer is printed on the core to form a multilayer antenna module. The prepreg and the core each have thickness h=0.2 mm, and are separated by a ground plane. The thickness t of printed copper is 35 μm (i.e., 1 oz.) for all three metal layers. An antenna-in-package (AiP) implementation of the antenna module is intended for integration with the CMOS chip, as illustrated in FIG. 1. The AiP solution offers much higher radiation efficiency and signal-to-noise ratio over an antenna-on-chip implementation. The antenna module can be surface mounted on the PCB board using solder balls to connect the inputs of the Butler matrix on the feed layer to the transceiver circuits on the CMOS chip. The solid ground plane, not only helps to minimize interference by blocking antenna radiation into the feed layer and CMOS circuits underneath, but it also decouples the antenna and feed layer. This greatly simplifies the design process since the antenna array and Butler matrix can be designed independently of one another and stacked together afterwards without significant performance degradation.

A. Microstrip Implementation of Butler Matrix

Figure 5A:
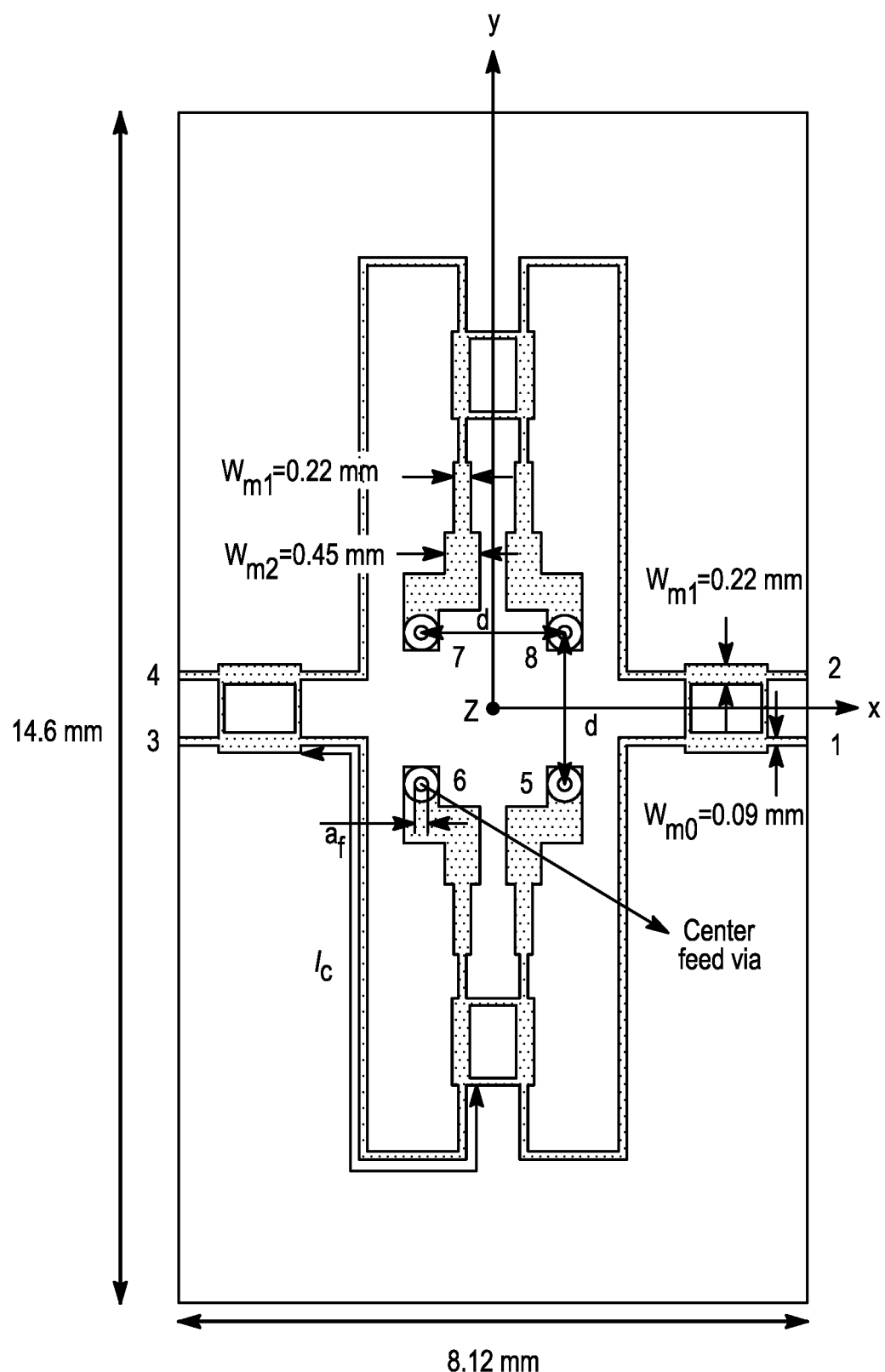
FIG. 5(a) shows a HFSS 3D model of the microstrip line 4×4 2-D Butler matrix and FIG. 5(b) shows the inter-element phase shifts $(\beta_{x1})_1$, $(\beta_{x2})_1$, $(\beta_{y1})_1$ and $(\beta_{y2})_1$ at the matrix output when port 1 is excited.

The high frequency structural simulator (HFSS) 3D model of the Butler matrix in microstrip form is shown in FIG. 5(a). On the given prepreg, the 50Ω lines are too wide at 60 GHz to realize the hybrids with sufficient separation between their arms and achieve good performance. Therefore, the microstrip lines of characteristic impedance 100Ω are used to realize the hybrids, and hence most of the Butler matrix. The input ports 1 to 4 also have 100Ω impedances which must be transformed to 50Ω for probing (see Section IV-A). The 100Ω lines at the output of the top and bottom hybrids in FIG. 5(b) must also be transformed so that they can be matched to 50Ω antenna elements. This is done using quarter-wave lines. The vias at the output ports 5 to 8, each have diameter $a_f$ of 0.15 mm and serve to feed the antenna elements. The inter-coupler distance $l_c$ is set so that it is long enough to interconnect the hybrids under the given layout and routing constraints. With $l_c$=8.11 mm, there is sufficient separation between the neighboring lines so that they do not couple with one another. This length can be conveniently set without affecting the phase difference at the matrix output.

The S-parameters of the microstrip line Butler matrix are obtained by performing full wave simulation in HFSS. The input and output ports have impedances of 100Ω and 50Ω respectively and are labeled in FIG. 5(a). The output ports j=5 to 8 at the ground plane would eventually be connected to the antenna elements on the antenna layer later. The simulated reflection coefficient magnitude ($|S_{ii}|$) of the Butler matrix for all identical input ports i=1 to 4 is −28 dB at 60 GHz and less than −10 dB across the band (56-67 GHz) indicating a broad impedance match.

A lossless 4×4 2-D Butler matrix divides the input power equally at its four output ports (i.e., −6 dB). This decrease in transmission is not an actual loss since the divided power is recombined in the array main beam. In the presence of losses that are unavoidable in the microstrip implementation of the matrix, the input signal experiences different levels of path loss due to differences in the path lengths from the input to the outputs. Therefore, the magnitudes of transmission coefficients ($|S_{ji}|$), for the Butler matrix in FIG. 5(a), from input port i=1, to output ports j=5 to 8 will not be equal due to uneven losses. The inter-element phase shifts $(\beta_x)_i$ and $(\beta_y)_i$ for port i excitation can be derived from the phase difference between the transmission coefficients as follows.

$$(\beta_x)_i = \begin{cases} (\beta_{x1})_i = (\beta_{a_{2,1}})_i = (\beta_{8,7})_i = \angle S_{8i} - \angle S_{7i} \\ (\beta_{x2})_i = (\beta_{a_{4,3}})_i = (\beta_{5,6})_i = \angle S_{5i} - \angle S_{6i} \end{cases} \quad (5)$$

$$(\beta_y)_i = \begin{cases} (\beta_{y1})_i = (\beta_{a_{2,4}})_i = (\beta_{8,5})_i = \angle S_{8i} - \angle S_{5i} \\ (\beta_{y2})_i = (\beta_{a_{1,3}})_i = (\beta_{7,6})_i = \angle S_{7i} - \angle S_{6i} \end{cases} \quad (6)$$

where i=1 to 4.

Figure 5B:
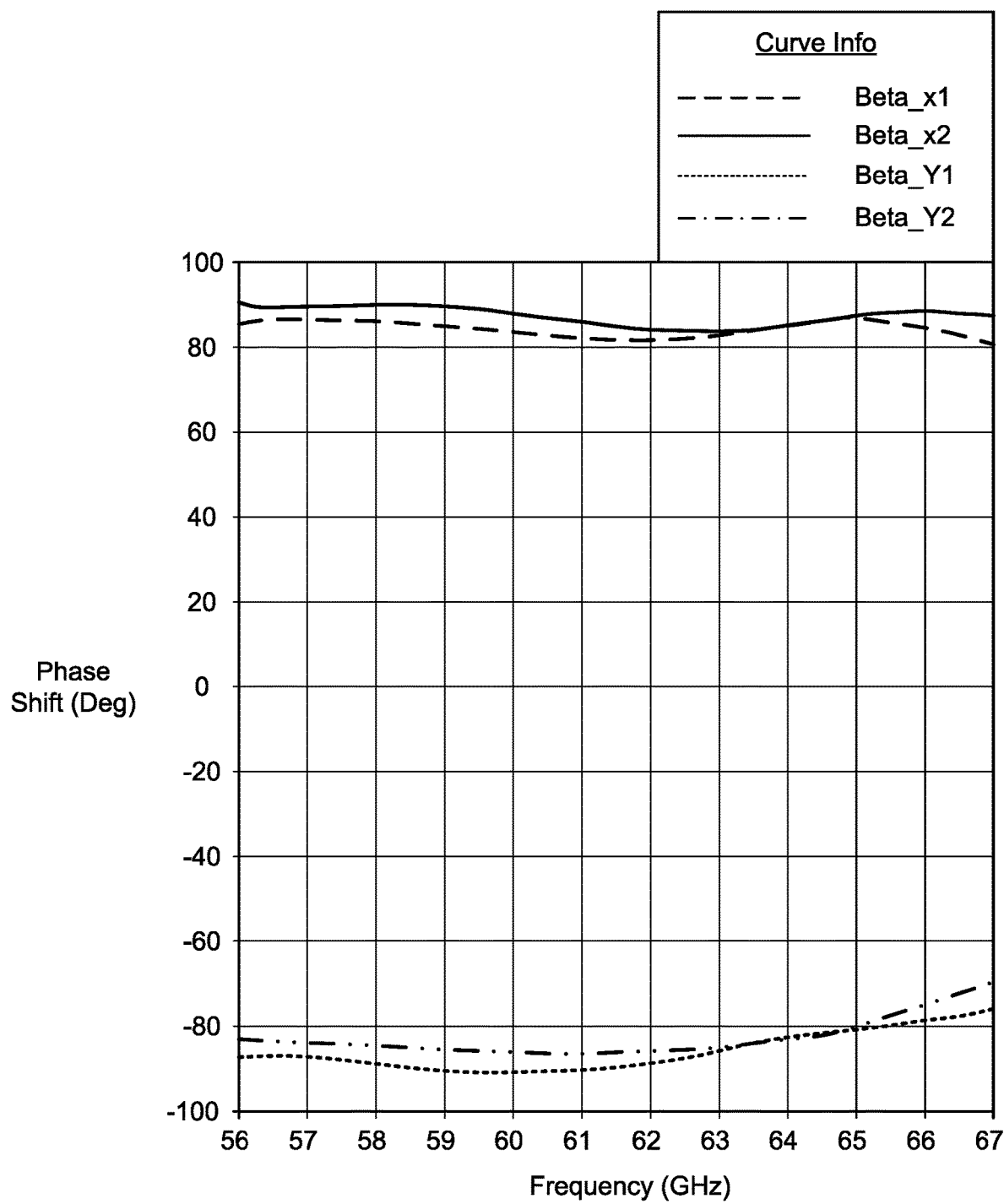

For port i=1 excitation, the inter-element phase shifts $(\beta_{x1})_1$, $(\beta_{x2})_1$, $(\beta_{y1})_1$ and $(\beta_{y2})_1$ are plotted in FIG. 5(b). At the design frequency of 60 GHz, it can be seen that $(\beta_{x1})_1\approx+85°$, $(\beta_{x2})_1\approx+90°$, $(\beta_{y1})_1\approx-90°$, and $(\beta_{y2})_1\approx-85°$. This matches the expected values in Table I within a small ±5° margin. Moreover the phase shifts are maintained over a wideband. The values in Table I are checked and verified for other port excitations but the results are not included here because of similarity with the plot shown and for conciseness.

B. Circular Patch Planar Array

Figure 6A:
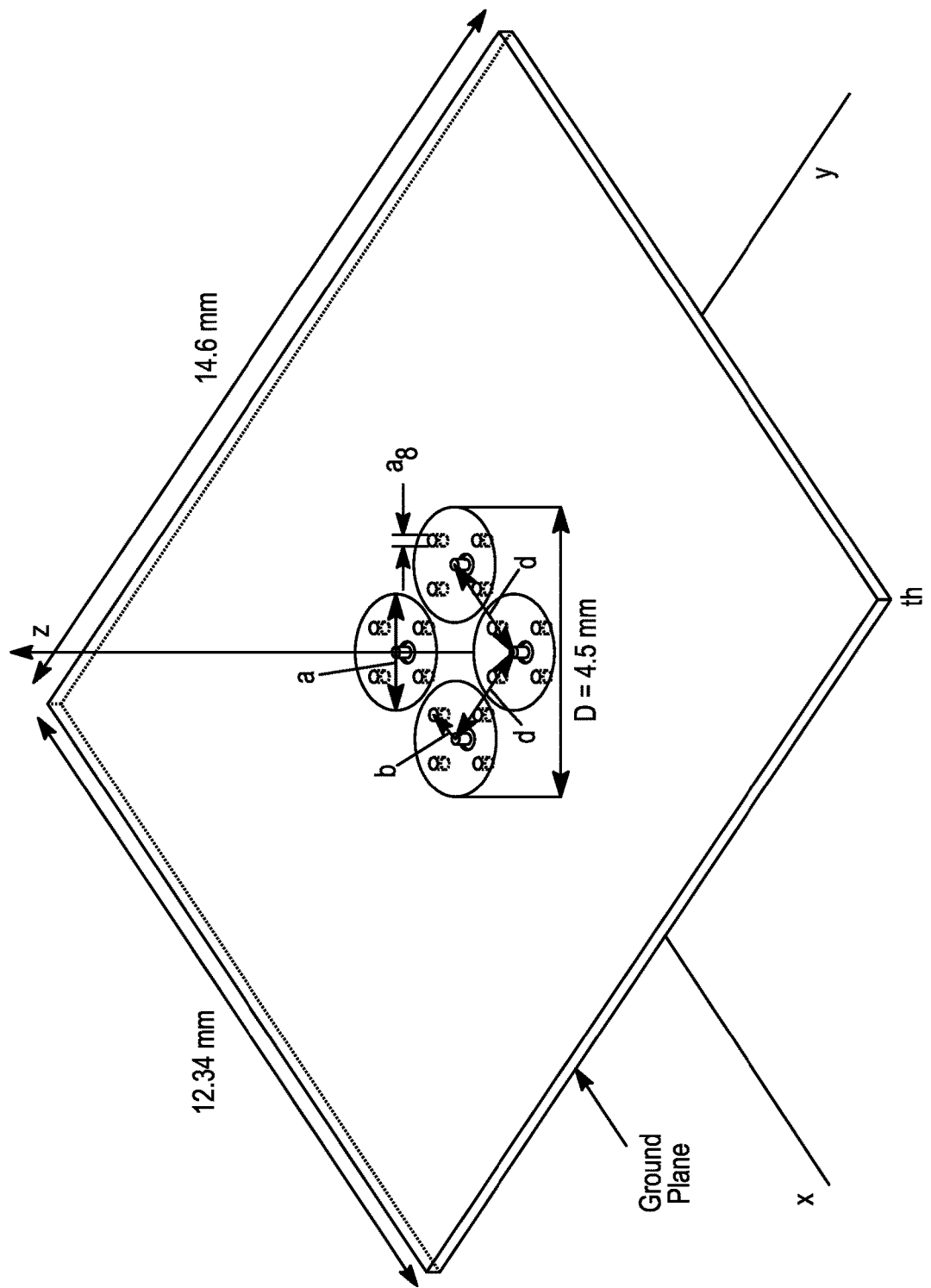
FIG. 6(a) shows a HFSS 3D model of the 2×2 circular patch planar array and FIG. 6(b) shows simulated gain patterns (dB) of the array at 60 and 67 GHz in the horizontal plane ($\theta=90°$) with the main beam at $\varphi_0=+135°$.

For the chip-to-chip communications depicted in FIG. 2, the selection of the antenna element for the arrays is driven by the need to maximize lateral (end-fire) radiation, improve surface wave excitation, and consequently the horizontal transmission (i.e., between the antennas in the same plane). The antenna element used in this work is a center fed circular patch with four side vias. Four of the circular patch elements are used to make a 2×2 circular patch planar array, the HFSS 3D model of which is shown in FIG. 6(a).

The antenna elements forming the antenna layer are printed on a Rogers RO4003C core of thickness h=0.2 mm (also illustrated in FIG. 1). The circular patch elements have higher lateral radiation than previous circular stacked patches in, previous ME dipoles and antenna arrays, and thus are better suited for end-fire scanning. The inter-element separations, $d_x$ and $d_y$ are both fixed at d=1.86 mm using (3) at wavelength $\lambda_0$=5 mm, corresponding to 60 GHz center frequency. The ground plane size is 14.6 mm×12.34 mm. The diameters of the center feed via $a_f$ and four side vias $a_s$ are 0.15 mm each and the side vias are located at radial distance b=0.67 mm from the patch center.

Figure 6B:
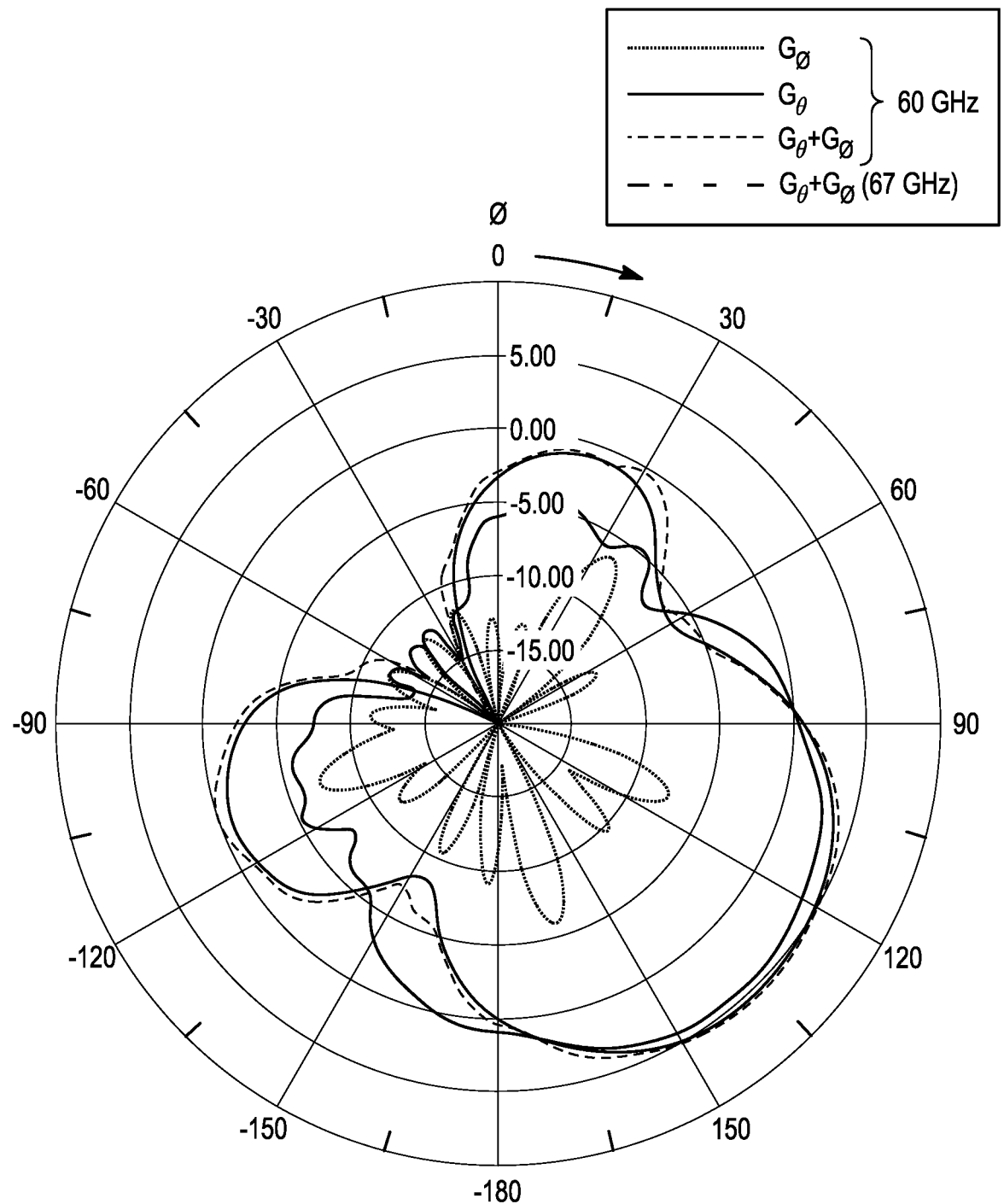

The horizontal gain pattern of the array at 60 GHz obtained by setting $\beta_x$=+90° and $\beta_y$=−90° in the simulation (realized by exciting the elements with proper phase difference) is shown in FIG. 6(b). The main beam of the array is pointed at $\varphi_0$=+135°, which verifies with the expected value in Table I for the phase shift combination used. The gain pattern shows both the vertical $G_\theta$ and the horizontal $G_\varphi$ gain components along with their total ($G_\theta+G_\varphi$). The total peak gain of the array is 5.5 dBi at 60 GHz (in the horizontal xy-plane). Most of the radiated field of the array is vertically polarized. The $G_\theta$ component is around 15 dB higher than the $G_\varphi$ component along the main beam direction $\varphi_0$=+135°. The highest $G_\varphi$ level of the array is around 11 dB below the peak gain. The simulated radiation efficiency of the array $e_r$=96% at 60 GHz.

III. Packaging of Multilayer Antenna Module

Figure 7A:
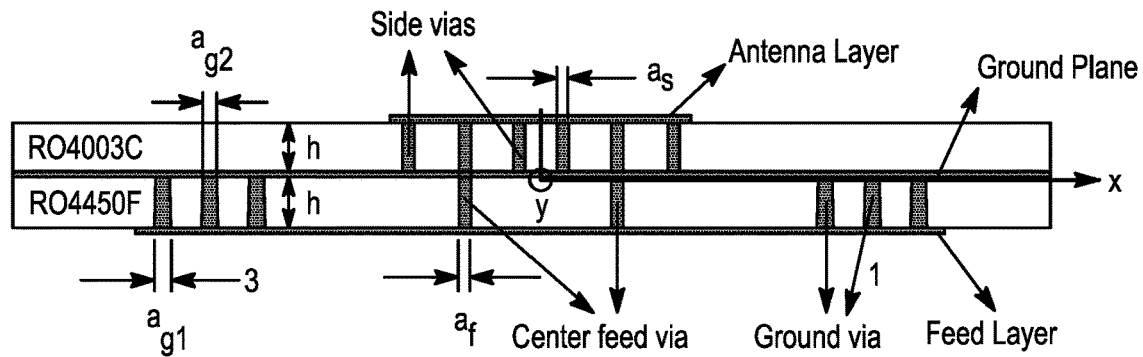
FIGS. 7(a) and 7(b) show a side view and top view, respectively, of an HFSS 3D model of the multilayer antenna module

A. Input Transformation, Stacking and Integration of Butler Matrix with Circular Patch Planar Array The Butler matrix (feed layer) of FIG. 5(a) is stacked with the circular patch planar array of FIG. 6(a) with their xy-planes aligned and the ground plane in between, to realize the multilayer antenna module shown in FIGS. 7(a) and (b). The substrate size had to be slightly increased to 17.14 mm×14.9 mm for fabrication convenience. The ground plane should shield and decouple the two layers from one another so that both the feed network and the antenna array work as designed with minimal performance changes after stacking and integration. As shown in FIG. 7(a), each patch element on the antenna layer is center fed from an output of the Butler matrix from the feed layer using the PTH via connection (of diameter $a_f$) through the ground plane.

Figure 7B:
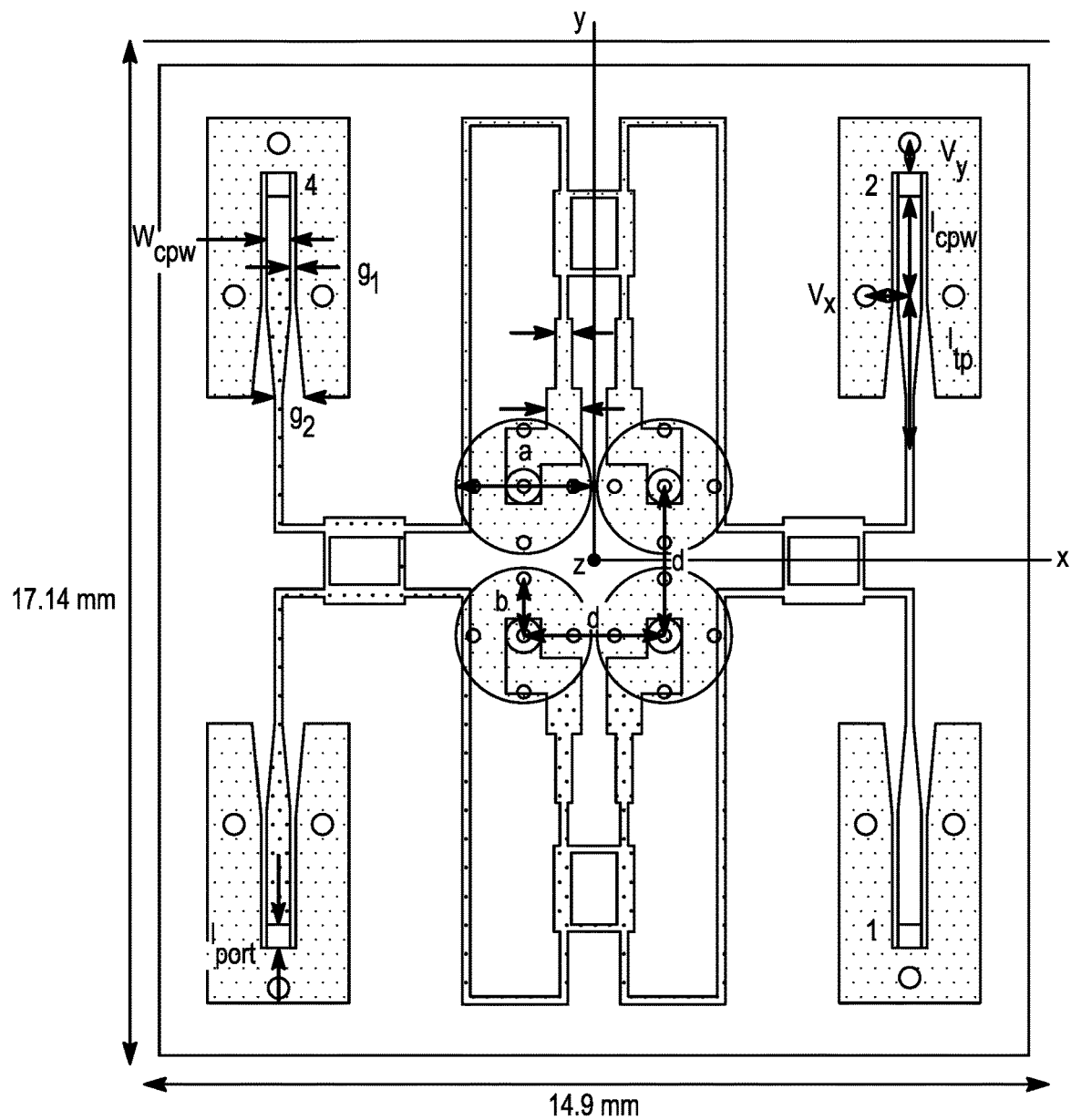

The input ports i=1 to 4 of the Butler matrix must be transformed from 100Ω impedance to 50Ω impedance for measurement convenience. Conductor backed coplanar waveguide (CB-CPW) to microstrip (MS) transitions are augmented at the input of the Butler matrix (i.e., the left and right hybrids in FIG. 5(a)) to realize this transformation as shown in FIG. 7(b). The CB-CPW pads provide a compatible, stable and convenient interface for the Ground-Signal-Ground (GSG) probes of a Network Analyzer when making measurements. In this work, the CB-CPW feed lines are probed using 250 μm pitch GSG probes. In order to achieve a smooth and broadband transition, the 100Ω microstrip lines are connected to the 50Ω CB-CPW lines by linearly tapering the width of the interconnecting lines from $w_{m0}$ to $w_{cpw}$ and the gap from $g_2$ to $g_1$, as shown in FIG. 7(b). The gap $g_2$ was adjusted to improve the reflection coefficient magnitude (at 60 GHz) and the impedance bandwidth of the transitions. The line impedances were all verified from full wave simulation. The side and back traces of the CB-CPW lines must be grounded by connecting them to the ground plane layer. This is done by using three ground vias for each CB-CPW line. The important dimensions of the antenna array and the CB-CPW to MS transitions are labeled in FIGS. 7(a) and (b), and are summarized in Table II.

TABLE II

DIMENSIONS OF THE ANTENNA ARRAY AND CB-CPW TO MS TRANSITION

| Dimension | Definition | Value |
|---|---|---|
| A | Diameter of circular patch | 1.8 mm |
| D | Inter-element separation | 1.86 mm |
| H | Laminate thickness | 0.2 mm |
| T | Copper thickness | 35 μm |
| $a_s$ | Diameter of side via | 0.15 mm |
| $a_f$ | Diameter of center feed via | 0.15 mm |
| B | Radial distance of side via center from patch center | 0.67 mm |
| $a_{g1}$ | Diameter of ground via at the feed layer | 0.23 mm |
| $a_{g2}$ | Diameter of ground via at the ground plane | 0.19 mm |
| $W_{cpw}$ | Width of 50 Ω CB-CPW line | 0.3 mm |
| $g_1$ | Gap between signal trace and side ground for 50 Ω CB-CPW line | 0.08 mm |
| $g_2$ | Gap between signal trace and side ground at the CB-CPW/MS interface | 0.28 mm |
| $l_{cpw}$ | Length of 50 Ω CB-CPW line | 1.27 mm |
| $l_{tp}$ | Length of CB-CPW to MS taper | 1.27 mm |
| $l_{port}$ | Length of CB-CPW port | 0.3 mm |
| $(v_x, v_y)$ | Location of ground via (see FIG. 7(b)) | (0.57, 0.36) mm |

Figure 7C:
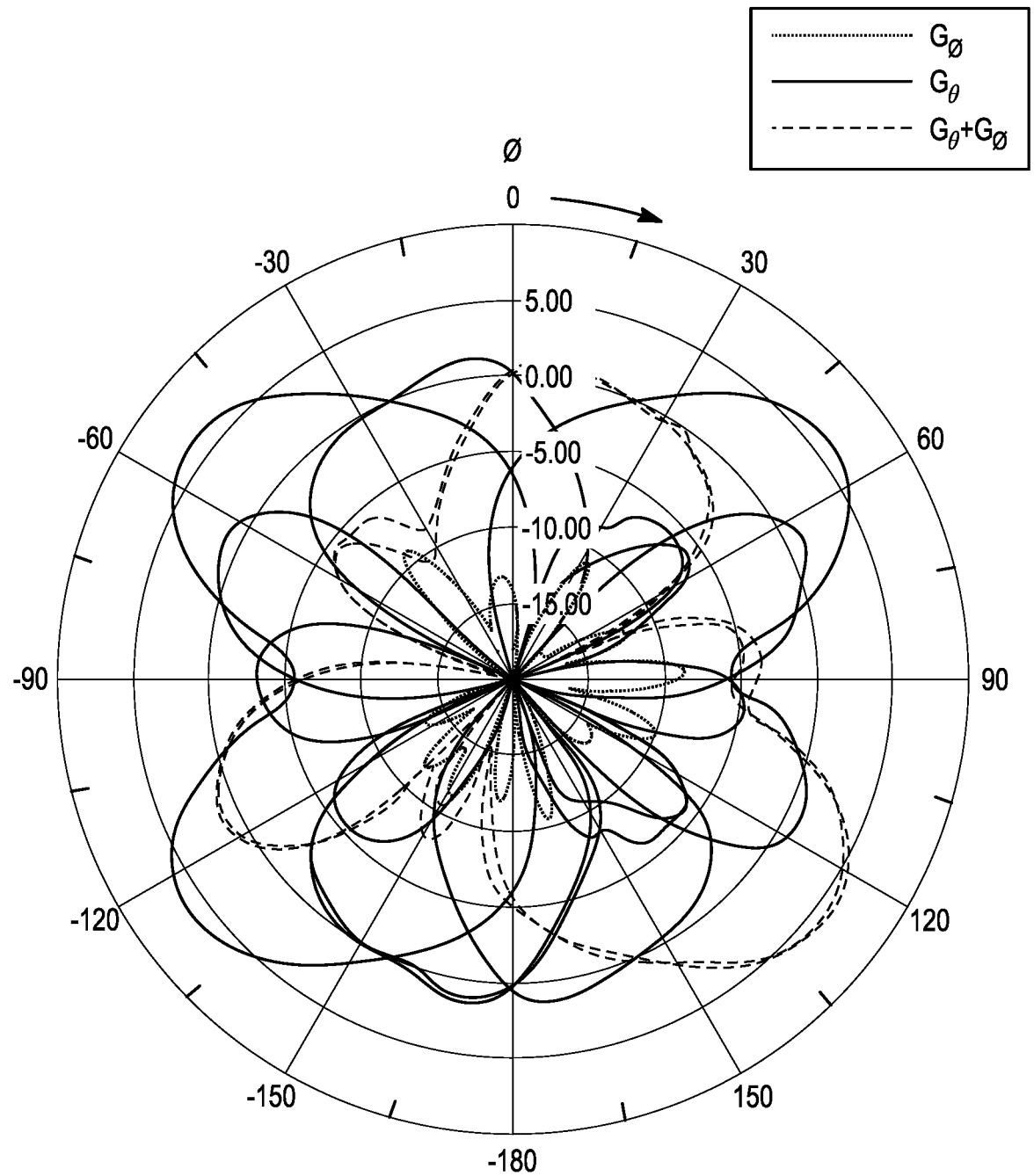
FIG. 7(c) shows simulated gain patterns (dB) at 60 GHz in the horizontal plane ($\theta=90°$) illustrating switching of the main beam: Port 1 ($\varphi_0=+135°$), Port 2 ($\varphi_0=-135°$), Port 3 ($\varphi_0=+45°$) and Port 4 ($\varphi_0=-45°$).

The CB-CPW inputs of the Butler matrix are individually excited to switch the main beam of the module in the four diagonal directions. Each port excitation attains a combination of inter-element phase shifts given in Table I and produces a main beam in one of the four diagonal directions. A port is individually excited in HFSS by setting its amplitude to 1 while setting the amplitude of other ports to 0. The switching of the main beam can be seen in the horizontal gain patterns (θ=90°) shown in FIG. 7(c), corresponding to the four different port excitations. The antenna module has a peak gain of 5.3 dBi at 60 GHz in the diagonal directions ($φ_0$) in the xy plane. This gain is with the Butler matrix and CPW transitions included. The highest side lobe level is 1.3 dBi. Comparing FIGS. 6(b) and 7(c), we can see that the presence of the feed layer has reduced the peak gain slightly and increased the side lobe level. The radiation from the feed layer has caused the pattern in FIG. 7(c) to be more directive and asymmetric than the pattern in FIG. 6(b). The antenna module also radiates mostly in the $G_θ$ polarization (around 19 dB higher than the $G_φ$ polarization) along the diagonal directions. The highest $G_φ$ level of the antenna module has reduced to 14 dB below the peak gain (compared to just 11 dB for the array by itself). The feed layer losses and radiation have affected the overall $G_θ$ and $G_φ$ levels differently. This can be explained as follows. The radiation from the microstrip lines in the feed layer is mostly vertically polarized. To verify this, the simulated radiation pattern of the feed network in FIG. 5(a) was analyzed. This radiation contributes more to the $G_θ$ component of the module and thus there is lower reduction than the $G_φ$ component. The feed layer radiation actually helps to overcome most of the losses introduced and thus maintain the overall gain ($G_{mod}$) of the module along the main beam direction, which can be written as, $$G_{mod}(θ,φ) = e_{mod} D_{mod}(θ,φ) \quad (7)$$

where $e_{mod}$ and $D_{mod}$ are the radiation efficiency and directivity, respectively, of the array combined with the feed network. The reduction in overall radiation efficiency is compensated by the increase in directed radiation along the main beam direction (focusing effect).

The module achieved a simulated $e_{mod}$=76% at 60 GHz. Note that $e_{mod}$ is lower than $e_r$ (=96%) because the module includes the feed layer whose losses are taken into account when determining the overall efficiency. To increase the directivity of the array, d can be increased or more elements can be used with relatively small increase in the array footprint. However, a larger feed network will be required, and the feed losses will increase as well. To ensure an overall increase in $G_{mod}$, the factor by which $D_{mod}$ increases must be greater than the factor by which $e_{mod}$ decreases. Having more elements will also increase the number of switchable beams.

C. Gain Bandwidth, Beam Squint and Beam Broadening

Figure 8:
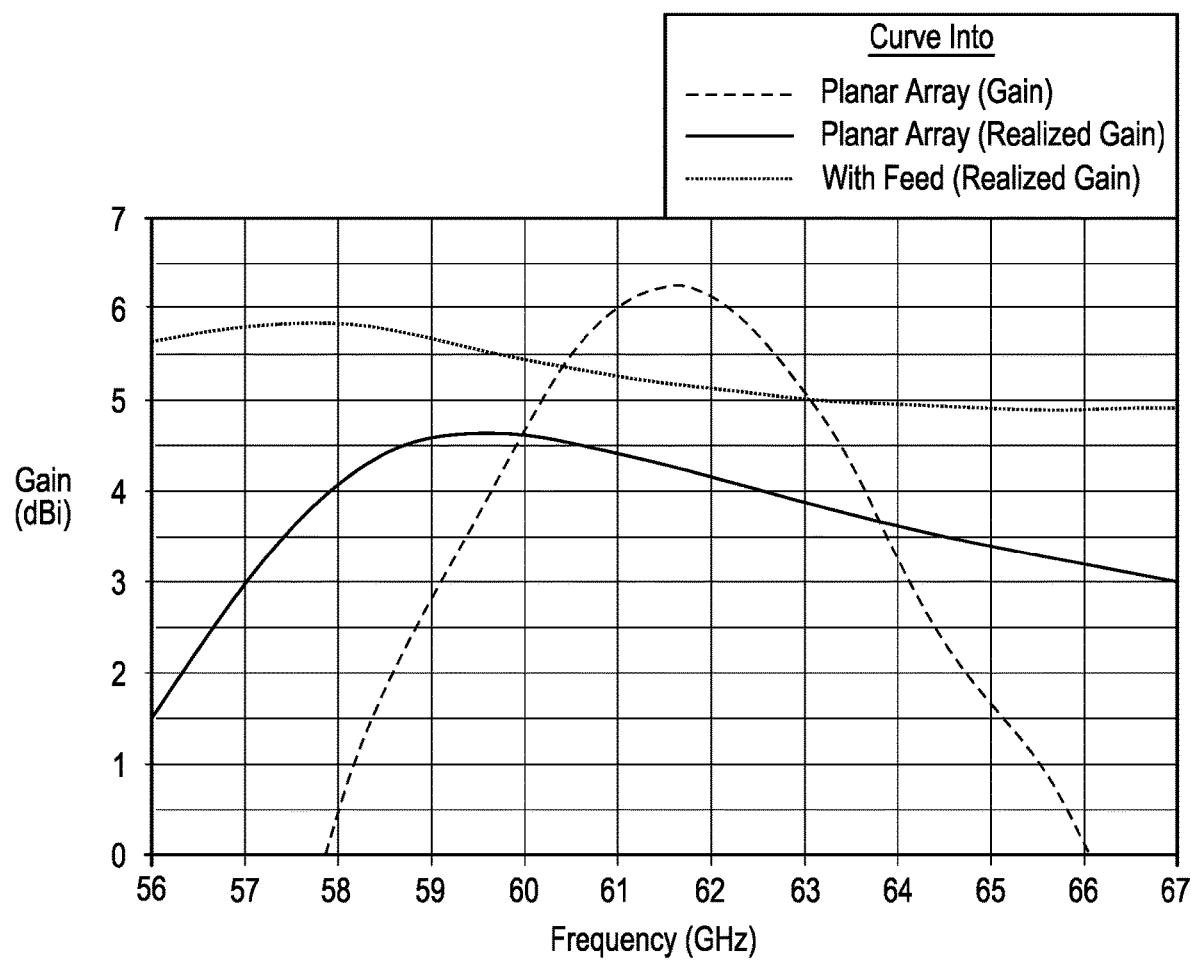
FIG. 8. shows the gain response of the planar array along the main beam direction $\varphi_0=+135°$ with and without the Butler matrix.

The gain bandwidth of an antenna array is defined as the frequency range where the drop in gain is within 3-dB of the value at the center frequency. The gain variation of the 2×2 circular patch planar array along $φ_0$=+135° with and without the Butler matrix/transitions is shown in FIG. 8. For the case of the planar array by itself, the elements were excited with equal amplitude and flat phase shifts $β_x$=+90° and $β_y$=−90° over the entire band. There is only 1 dB variation in gain and therefore the gain bandwidth of the array by itself is more than 11 GHz.

The gain variation could be due to some combination of element pattern, array factor and mutual coupling variations.

The normalized array factor $AF_n$ of a uniform planar array, ignoring mutual coupling, is given by, $$AF_n(k_0, \theta, \varphi) = \cos\left(\frac{k_0 d_x \sin\theta\cos\varphi + \beta_x}{2}\right)\cos\left(\frac{k_0 d_y \sin\theta\sin\varphi + \beta_y}{2}\right) \quad (8)$$

The $AF_n$ varies with frequency for constant phase shifts $\beta_x$ and $\beta_y$. It can manifest as beam squint and/or beam broadening in the radiation pattern. Beam squint can limit the gain bandwidth of an array by shifting the main beam away from the line-of-sight (LoS). For the planar array, the main beam direction, from (1) and (2), is given by, $$\varphi_0 = \tan^{-1}\frac{\beta_y}{\beta_x} \quad (9)$$

The planar array will have a stable main beam as long as the ratio $\beta_y/\beta_x$ stays constant with frequency. This is assuming that the element pattern and mutual coupling variations do not dominate. Since the proposed matrix has $\beta_x$ and $\beta_y$ responses that are relatively flat (see FIG. 5(b)) and follow one another, it should only cause negligible beam squint. In FIG. 6(b), the radiation patterns at 60 GHz and 67 GHz are shown and there is no noticeable beam squint. The elements were uniformly excited. The phase shifts obtained at the matrix output was used for the 67 GHz case (see FIG. 5(b)). The pattern at 67 GHz is broader, more asymmetric and there is 1 dB reduction in gain compared to 60 GHz. Therefore, the slight gain reduction can be attributed to beam broadening.

At 67 GHz, the phase shifts at the matrix output in FIG. 5(b) deviate by $\Delta\beta_{x1}=-9.8\%$, $\Delta\beta_{x2}=-2.9\%$, $\Delta\beta_{y1}=+14.8\%$ and $\Delta\beta_{y2}=+21.8\%$ from the required phase $\beta_{req}=\pm 90°$ (given in Table I), calculated as follows.

$$\Delta\beta_{x,y} = \frac{\beta_{x,y} - \beta_{req}}{|\beta_{req}|} \quad (10)$$

These phase-shift deviations resulted in only 0.5 dB reduction in gain compared to the no deviation case $\beta_{req}=\pm 90°$ at 67 GHz. Thus, the array gain is not very sensitive to just the phase-shift deviations alone. Other factors contribute to the gain bandwidth reduction and must be considered.

The gain with the reflection (mismatch) losses at the array input taken into account is called the realized gain. The realized gain bandwidth can be defined using the same 3-dB criterion as the gain bandwidth. It is a more realistic metric of antenna performance since it takes into account both the gain and impedance bandwidth. The realized gain of the array is also plotted in FIG. 8, from which we can see that there is more variation in gain. When the planar array is integrated with the Butler matrix and CPW transitions, additional reflection losses are introduced between the blocks and the realized gain bandwidth of the overall antenna module is reduced to 6.75 GHz. Despite increased losses, the higher gain of the module in the 60-63.5 GHz range is due to the directive radiation from the feed layer and slightly larger substrate. The signal amplitude imbalance and variation at the matrix output can also reduce the bandwidth, in addition to making the radiation patterns more asymmetric.

IV. Hybrid Space-Surface Wave Interchip Communication in Mcmc Systems

Since the antenna module is designed for use in the MCMC system, let us consider a specific case of interchip communication between the diagonal neighbors in such a system.

A. Antenna Modules in MCMC System

Figure 9:
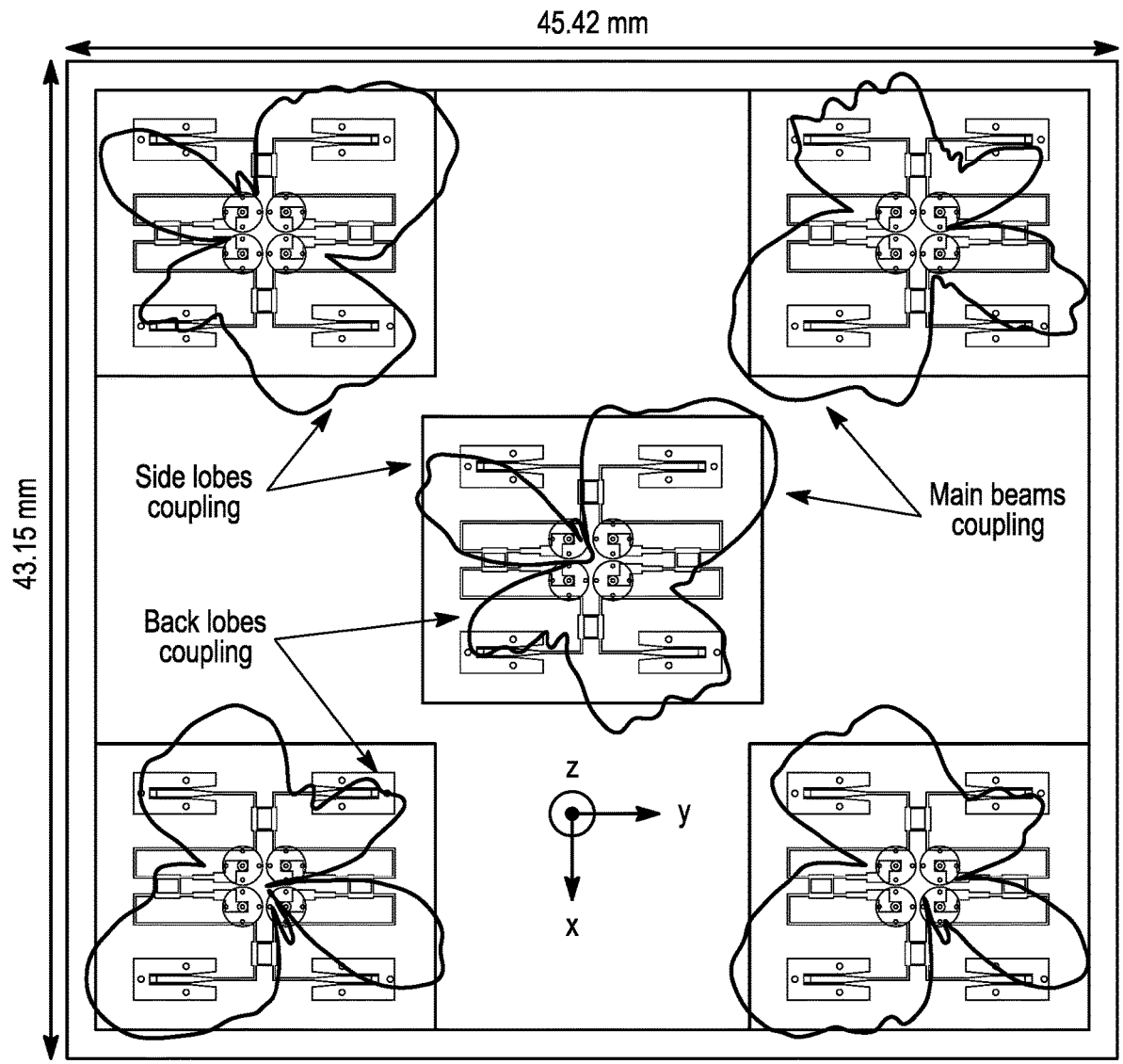
FIG. 9 is a HFSS 3D model of the MAM with five antenna modules showing interchip communication in the diagonal directions in the MCMC system with the 60 GHz simulated gain patterns (dB) of the modules being overlaid.

To emulate this scenario, consider the antenna module of FIG. 7(b) is mounted on the board over the chip routers A, C, E, G and I in FIG. 2. The HFSS 3D model of the five antenna modules forming a multi-antenna module (MAM) is shown in FIG. 9. The diagonal length (largest dimension) of the antenna array is D=4.5 mm (see FIG. 6(a)) and the far-field criterion is satisfied at all frequencies f≤67 GHz if the antenna arrays are separated by R≥9 mm. In FIG. 9, the modules are separated by a small interchip distance of R=20 mm in the diagonal directions. All antenna modules are identical to the module in FIG. 7(b). The substrates and ground planes of all modules are connected to form a larger common substrate and ground plane. This should help to reduce interference between the antenna and the feed layers of the MAM. This will also allow surface wave coupling to occur between the individual antenna modules, and thus improve interchip transmission.

To increase parallelism in MCMC systems, many pairs of chips are expected to communicate concurrently. Consider the beam configuration shown in FIG. 9, which is representative of a concurrent communication between several chips. FIG. 9 shows a HFSS 3D model of the MAM with five antenna modules showing interchip communication in the diagonal directions in the MCMC system. The 60 GHz simulated gain patterns (dB) of the modules are overlaid. A port is excited (indicated by arrows) on each antenna module E and C so that their main beams point at one another to allow for maximum transmission. Thus the pair E-C is referred to as the communicating pair and they are coupled through their main beams. At the same time, a port on each antenna module A, G and I is also excited so that their main beams point towards neighboring modules (consider that the MAM in FIG. 9 is larger and has additional modules surrounding it) other than module E. The radiation from antenna modules A, G and I in the direction of router E contribute to interference and vice versa. The goal is to maximize the radiation between antenna modules in the intended direction e.g., between E-C (communicating pair) while minimizing the radiation in other directions e.g., between E-A, E-G and E-I (interfering pairs). The 60 GHz simulated gain patterns of the modules are overlaid on the MAM to show the differences in the radiation coupling between the pairs. The pairs E-A and E-I are each coupled through their side lobes and the pair E-G is coupled through their back lobes. A qualitative analysis of radiation coupling for other beam configurations can be done similarly, using the individual radiation patterns of the modules (see FIG. 7(c)) and their orientation. For the interchip communication scheme to work properly, the contention among the modules must be avoided. For example, a contention occurs when modules A, G and I also point their main beam towards E (i.e., worst interference scenario). This could be avoided by using few wired control signals on the PCB so that when a pair of modules is communicating, the other modules cannot point their main beam towards the pair and interfere.

Figure 10A:
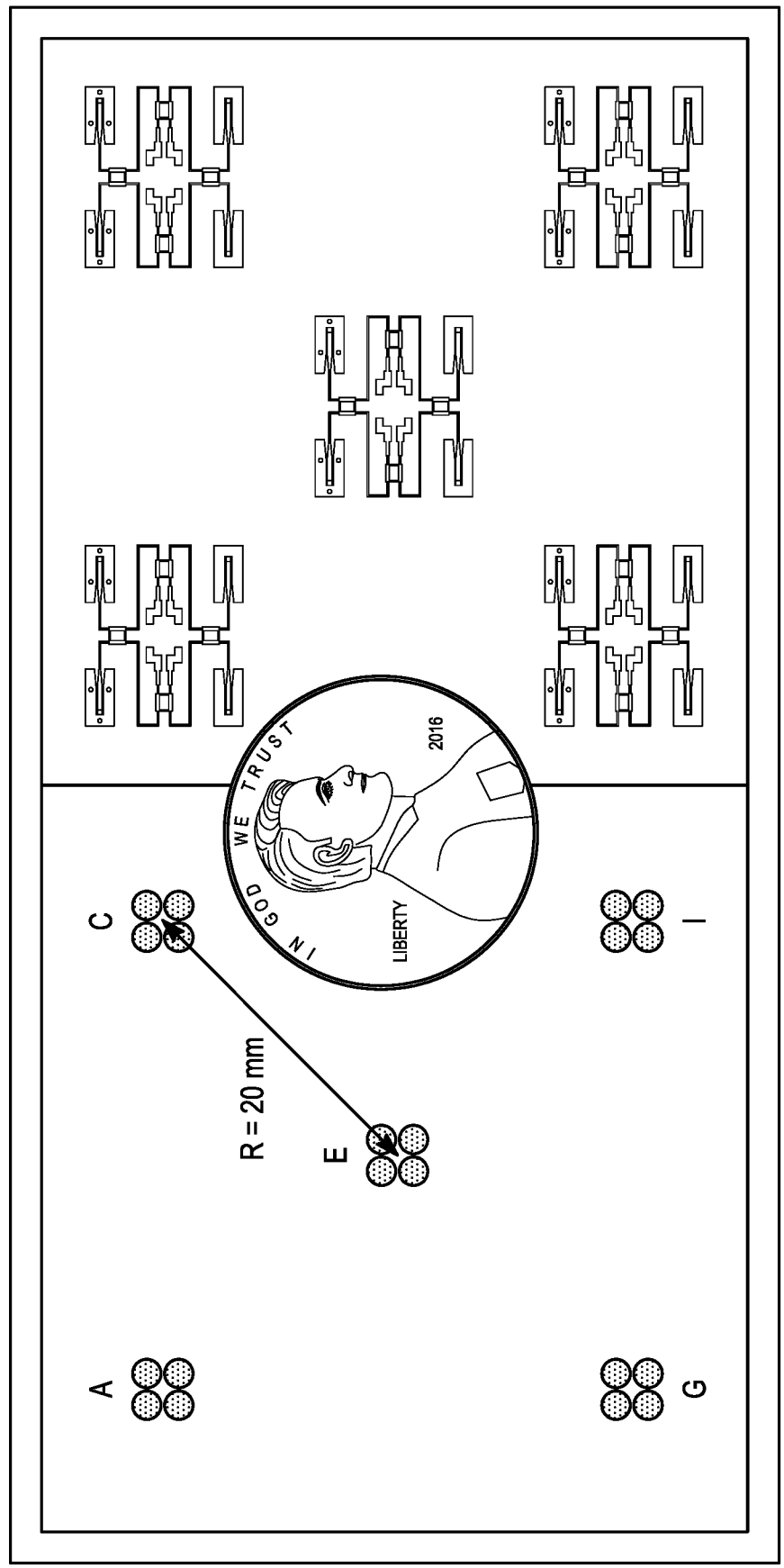
FIG. 10(a) shows fabricated PCB prototypes of the MAM, with five antenna modules on each being laid side by side to show the antenna and feed layers
Figure 10B:
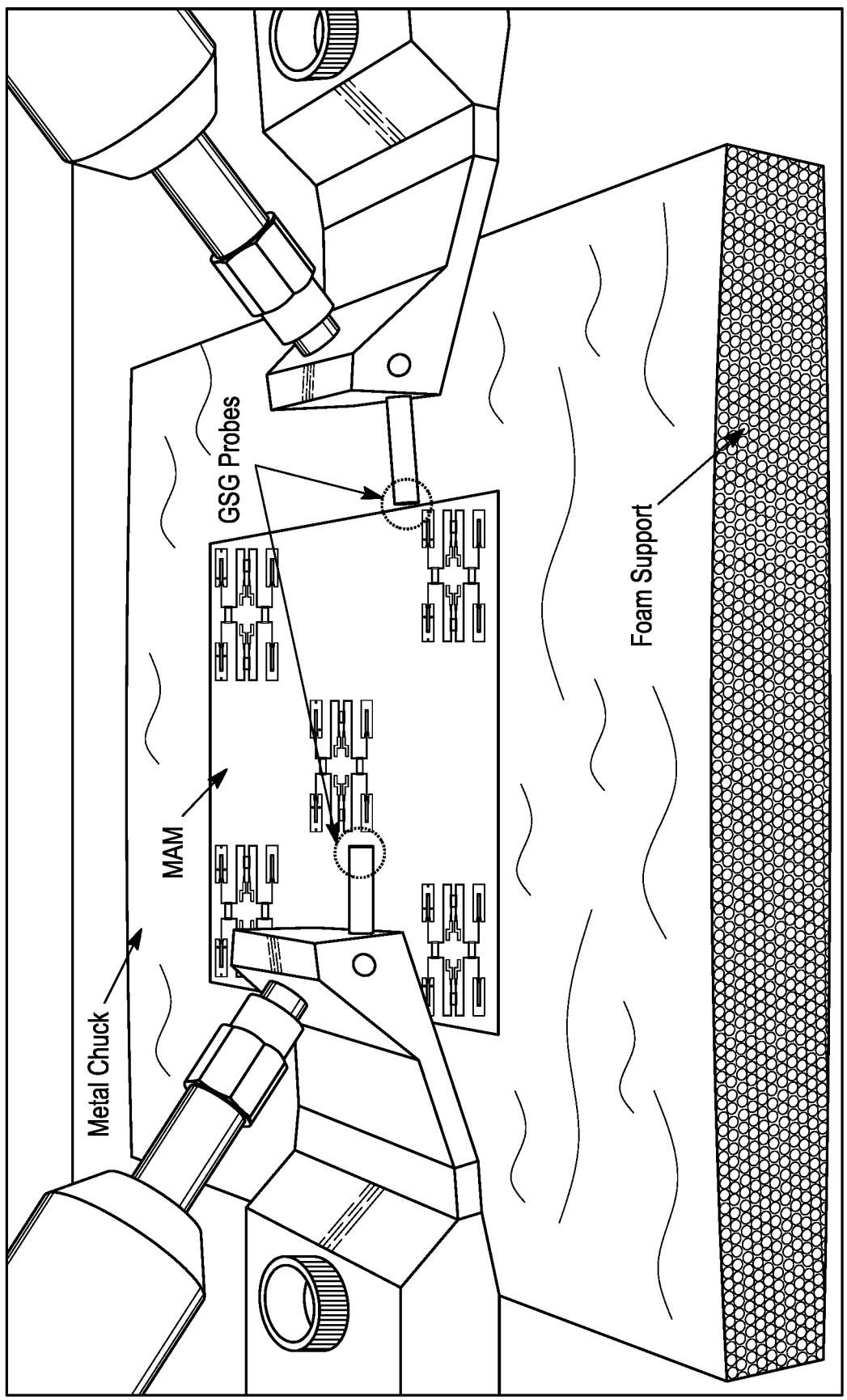
FIG. 10(b) shows the measurement setup of the prototype with GSG probes on CB-CPW feed lines.

The fabricated PCB prototypes of the MAM with the measurement setup are shown in FIG. 10, with five antenna modules on each, laid side by side to show the antenna and feed layers. FIG. 10(b) shows the measurement setup of the prototype with GSG probes on CB-CPW feed lines. The center feed and the side vias of the prototypes are mechanically drilled. The ground vias are laser drilled, and filled with copper.

B. Reflection Coefficient of Antenna Module

Figure 11:
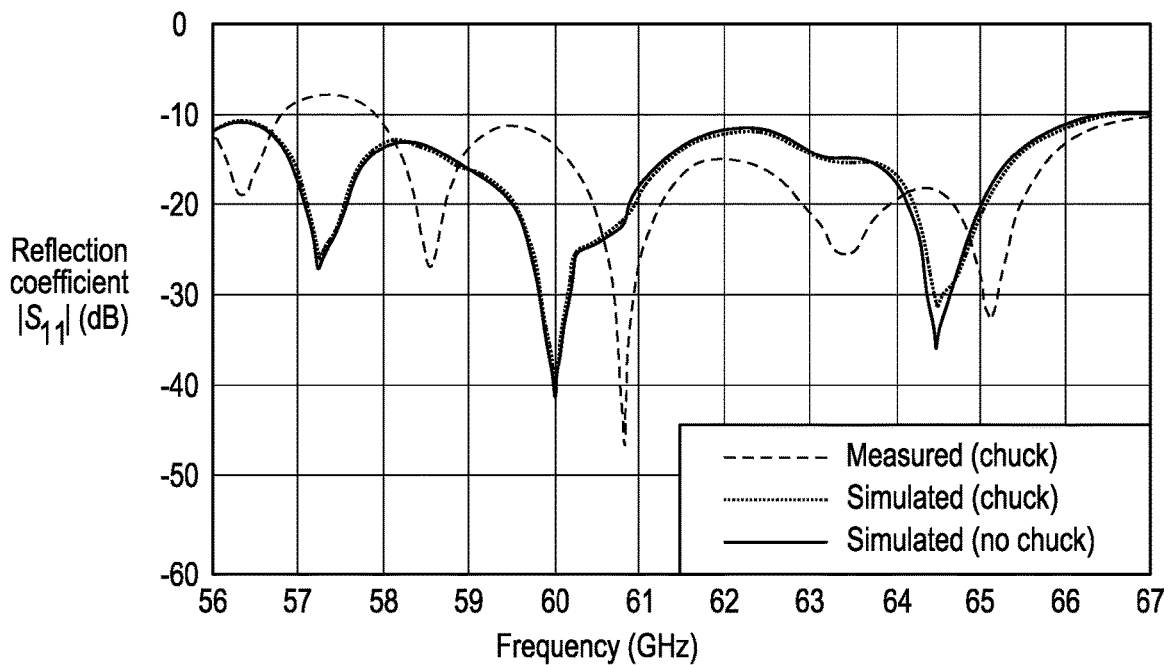
FIG. 11 shows the reflection coefficient (dB) of an antenna module on the MAM.

FIG. 11 shows the simulated and measured reflection coefficient at one of the CB-CPW inputs of an antenna module on the MAM. The measurement was made on the fabricated MAM prototype using 250 μm pitch GSG probes on a CB-CPW feed line (see FIG. 10(b)). The feed layer must face up to allow probing. The antenna layer faces down on a foam platform of 12 mm thickness. The foam is thick enough to create sufficient separation between the antenna module and the metal chuck underneath while still providing a stable platform. Without the foam, the antenna layer would be shorted out by the chuck. Furthermore, since the dielectric constant of foam is close to one, it should only cause minor perturbation in the near-field of the antenna modules and hence the measurements. Since the chuck cannot be removed during the measurements due to probing limitations, its effect must also be taken into account in the simulations. The chuck is modeled as an infinite perfect electric conductor (PEC) plane placed 12 mm (i.e., the foam thickness) above the antenna layer. Full wave simulations were performed both with and without the PEC. The reflection coefficients are negligibly affected by the presence of the chuck as seen from the close agreement between the simulated curves in FIG. 11. Based on the location of the resonance dips in FIG. 11, the measured reflection coefficient curve is shifted higher in frequency but other than that, a good agreement with the simulated curves is seen. This could be due to small deviations in laminate thickness, via locations, trace lengths, widths and gaps from their ideal design values during the fabrication process. The measured and simulated impedance bandwidths are 8.65 GHz and 9.75 GHz respectively, using the $|S_{11}| \leq -10$ dB criteria. The antenna module is able to achieve the broad bandwidth because of good impedance matching between the individual blocks, namely the CB-CPW transitions, the Butler matrix and the circular patch planar array. Specifically, the use of linear taper to reduce impedance mismatch at the CB-CPW/MS interface and the use of the common ground plane to decouple the antenna layer from the feed layer provided seamless integration with no significant performance degradation.

C. Interchip Transmission Coefficients

In order to assess the interchip wireless links in the diagonal directions in the MCMC scenario, the transmission coefficients between the antenna modules E-C, E-I, E-A, and E-G on the MAM were measured and simulated. The results are shown in FIG. 12. FIG. 12 shows the measured, and simulated transmission coefficients (dB) between the antenna modules on the MAM. (a) $|S_{CE}|$. (b)$|S_{IE}|$. (c) $|S_{AE}|$. (d) $|S_{GE}|$.

The chuck has caused perturbations in the transmission coefficients as seen from the comparison of the simulated curves with and without chuck. In FIG. 12, the transmission coefficients $|S_{CE}|$ for the communicating pair E-C are generally higher than the transmission coefficients $|S_{IE}|$, $|S_{AE}|$, and $|S_{GE}|$ for the interfering pairs E-I, E-A and E-G across the whole frequency band, for both measured and simulated values respectively. This is important in order to keep the signal levels on the wireless link higher than the interference levels and maintain a low bit-error-rate (BER) in the channel. Generally, the measured transmission is somewhat lower than the simulated transmission across the band for all pairs in FIG. 12. This could be due to non-ideal manufacturing process and the high tolerances associated with PCB fabrication, both of which results in a prototype that deviates from an optimized design. The differences in transmission coefficients $|S_{CE}|$, $|S_{IE}|$, $|S_{AE}|$, and $|S_{GE}|$ are due to differences in the gain (i.e., main lobe, back lobe and side lobes) of the antenna module E in the direction of the modules C, I, A, and G (see FIG. 9). The main lobe level must be maximized while minimizing the back and side lobe levels in order to optimize the signal-to-interference ratio (SIR) and the throughput. A detailed link budget analysis should take into account all the interference and noise sources in the given scenario to estimate the SIR (and hence the main and side lobe levels) required to achieve a given interchip data rate at a given BER for a particular modulation scheme.

The PCB prototypes in FIG. 10(a) are not perfectly flat. Specifically, the boards have curvature with each of their four corners in the same plane (bow condition). The boards bow because of asymmetrical stackup of the core, prepregs and copper distribution around the center of the PCB, as shown in FIG. 7(a). The boards are only 0.4 mm thick which could have also contributed to bowing. In order to lessen the effect, the boards were secured on the foam platform using tape when making the measurements as shown in FIG. 10(b). Bowing can cause both vertical and horizontal misalignment between the antenna modules on the MAM which can change the LoS antenna gains and thus affect transmission measurements. At 60 GHz, the surface roughness of the conductors can result in increased losses and other performance deviations. This could explain the small ripples seen in the measured curves. Still, there is good agreement in trend with slight shift in frequency between the measured and simulated results.

D. Link Decomposition and Transmission Bandwidth

The total mutual impedance $Z_{21}^{total}$ between any two antenna modules on the MAM is the sum of space wave $Z_{21}^{sp}$ and surface wave $Z_{21}^{sw}$ components as given below.

$$Z_{21}^{total} = Z_{21}^{sp} + Z_{21}^{sw} \tag{11}$$

The $Z_{21}^{total}$ between any two modules on the MAM is found by running the full wave simulation of the 3-D model in FIG. 9. The space wave component $Z_{21}^{sp}$ can be estimated by performing another full wave simulation of the MAM but after removing the intervening substrate and ground plane between the modules. By doing this, the modules are physically separated from one another. Therefore, the $Z_{21}^{sp}$ can be isolated since there is no direct surface wave coupling. This was done for the pairs E-C, E-A, E-G and E-I in FIG. 9, and the associated transmission parameters $|S_{21}^{total}|$ (simulated) and $|S_{21}^{sp}|$ (space) are shown in FIG. 12 for the no chuck case. Diffraction effects at the substrate/ground plane edges of the modules will introduce some errors in the estimation of $Z_{21}^{sp}$ but the thin nature of the substrate should help to keep such errors small. The surface wave component $Z_{21}^{sw}$ could then be estimated by subtraction, using (11). In this way, the total mutual coupling can be decomposed into its space and surface wave components.

Figure 12A:
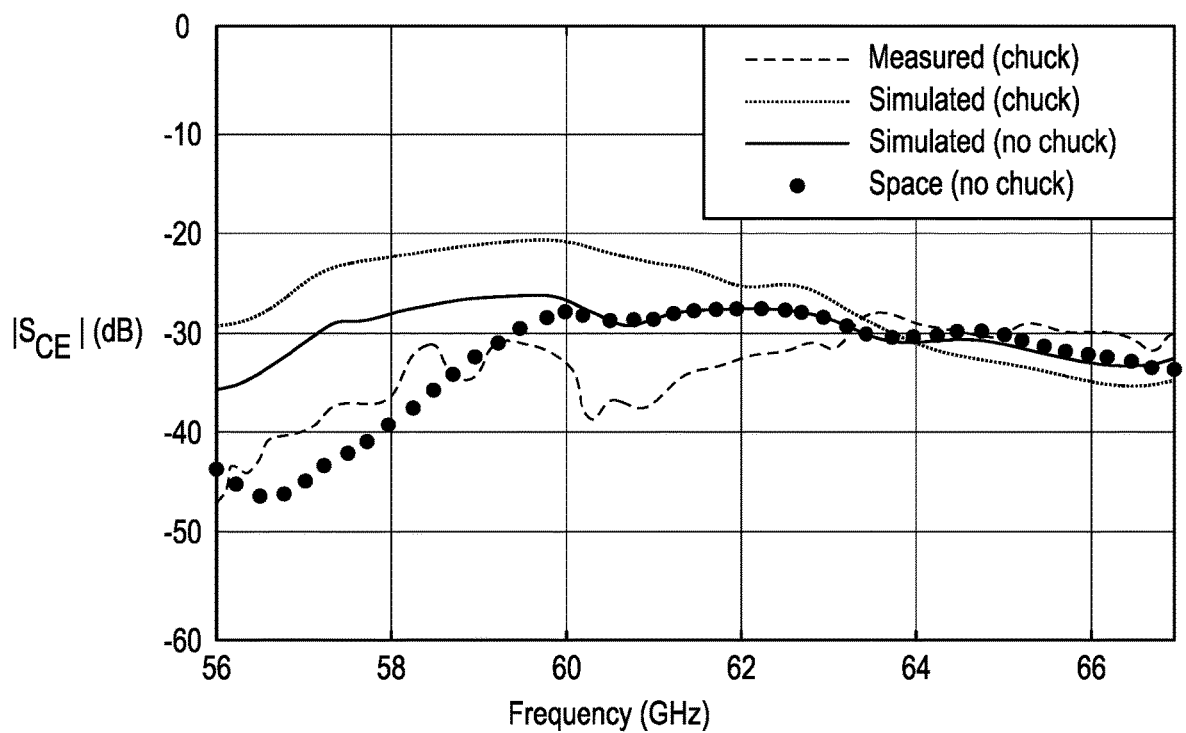
FIGS. 12(a)-12(d) show the measured, and simulated transmission coefficients (dB) between the antenna modules on the MAM, where
Figure 12B:
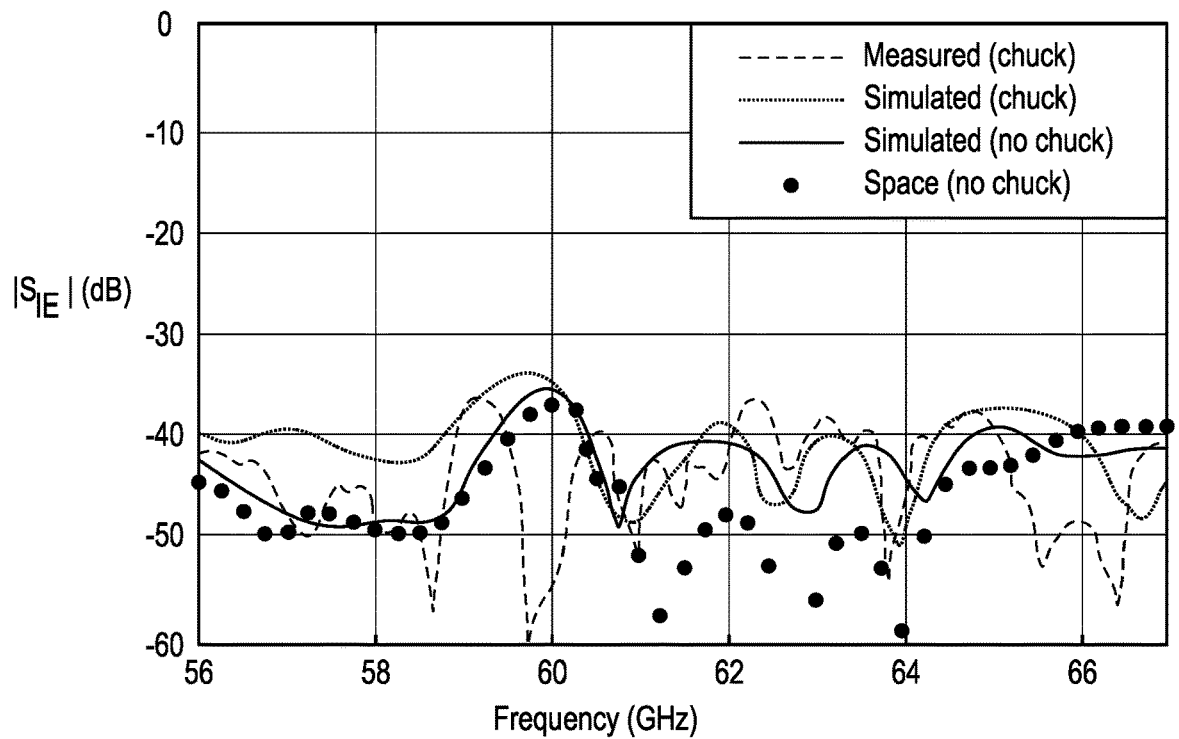
Figure 12C:
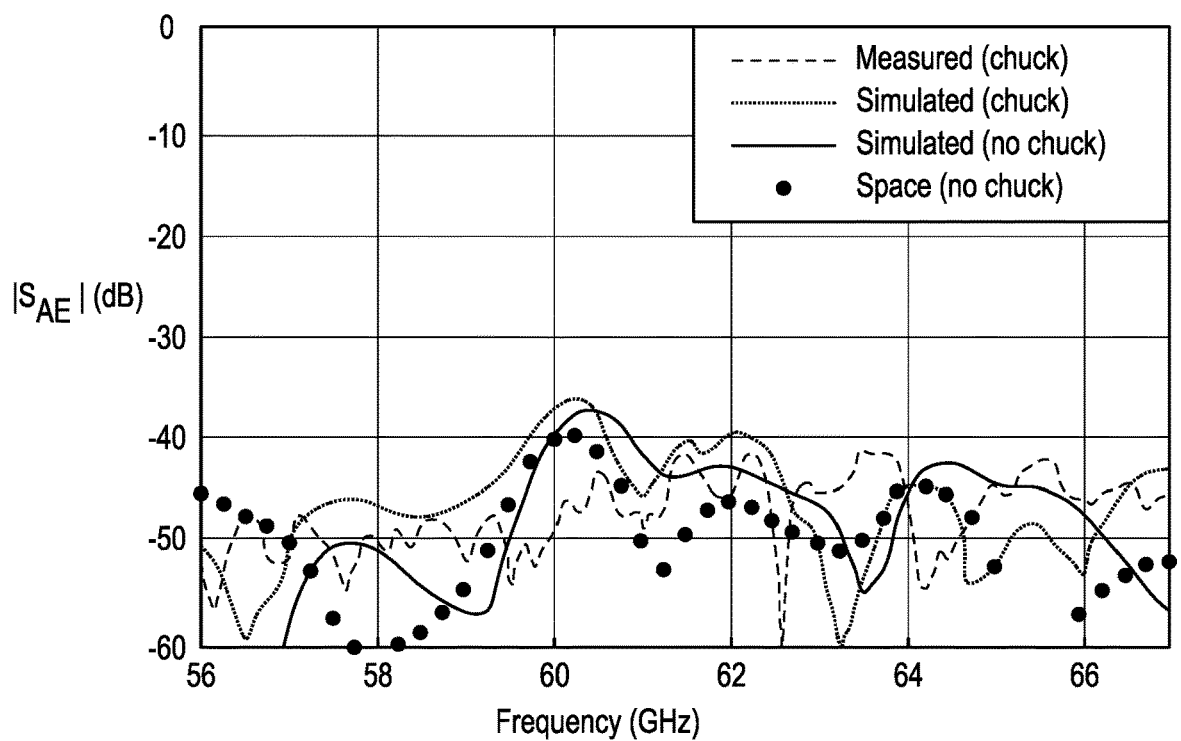
Figure 12D:
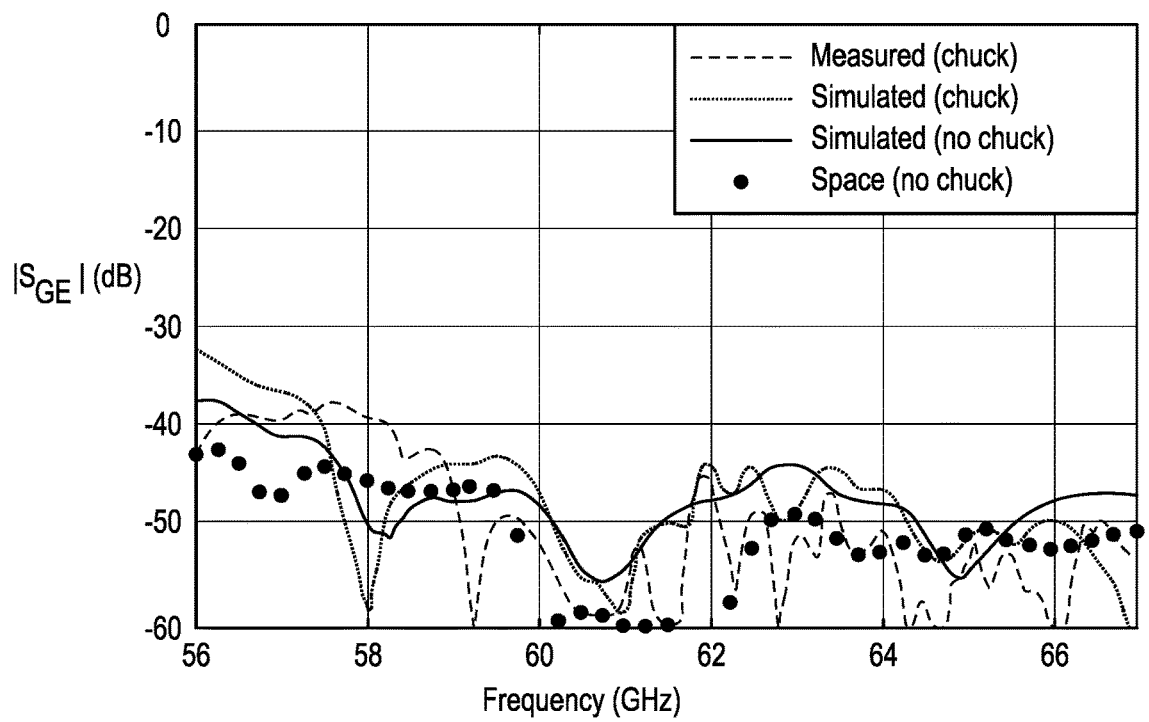

In FIG. 12(a), comparing the simulated (no chuck) and space transmission curves, the contribution of surface wave coupling can be seen to occur at and below 60 GHz. It has helped to increase transmission at those frequencies. As much as 11 dB improvement in transmission can be seen at 58 GHz. The surface wave coupling has also helped to improve the transmission flatness below 60 GHz. The transmission is mostly due to space waves above 60 GHz.

The "transmission bandwidth" of the link can be defined as the frequency range where the drop in transmission (i.e., $|S_{CE}|$) is within 3-dB of the value at the center frequency.

Using this criterion in FIG. 12(a), the transmission bandwidth of the proposed hybrid space-surface wave link is 6.25 GHz (simulated). The bandwidth of the link considering only the space wave coupling is reduced to 4 GHz. Therefore, the surface waves have significantly improved the transmission bandwidth. They can be useful to maintain link power especially at larger distances. To verify this, another set of simulation between the pair E-C with their separation R increased to 30 mm was conducted and the link decomposition technique was applied. About 3 dB improvement in transmission was seen at and above 60 GHz, and more than 11 dB at 58 GHz, due to the surface waves.

One disadvantage of surface wave coupling is that the interference levels have also increased at certain frequency points. However, since the increase in signal transmission is more consistent throughout the band, the surface waves should help to improve the overall SIR of the link.

A simplified link model that takes into account both the space and surface wave coupling between any two identically oriented antenna arrays in the far-field has been previously developed. As the separation R increases, the relative contribution of surface waves increases. This is because the surface waves decay at a slower rate i.e., $1/R$ compared to $1/R^2$ for the space waves. The link model is useful to reduce the number of simulations and to perform quick link analyses at the network layer, once the gain coefficients are determined. Recently, we estimated the gain coefficients for two fixed beam arrays at 60 GHz using the least-squares method. The link decomposition technique presented here when used with the least-squares method should provide better estimates of the coefficients but this is beyond the scope of this work. The features of the array presented here are compared with other 60 GHz switched-beam arrays (fed with Butler matrix) in Table III. Our array has the smallest footprint and provides 360° angular coverage in four diagonal directions. These features are advantageous for the chip-to-chip communication considered.

TABLE III

FEATURE COMPARISON OF 60 GHZ SWITCHED-BEAM ANTENNA ARRAYS FED WITH BUTLER MATRIX

| Ref. | Array Type | Scanning Coverage | No. of Beams | Butler matrix | Footprint ($mm^2$) |
|---|---|---|---|---|---|
| W. F. Moulder, W. Khalil, and J. L. Volakis, "60-GHz two-dimensionally scanning array employing wideband planar switched beam network," IEEE Antennas Wireless Propag. Lett., vol. 9, pp. 818-821, 2010. | 2 × 2 ME Dipoles | Broadside | 4 | SIW | 58 × 42 (est.) |
| P. Ioannides, and C. A. Balanis, "Uniform circular arrays for smart antennas," IEEE Antennas Propag. Mag., vol. 47, no. 4, pp. 192-206, Aug. 2005. | 1 × 8 ME Dipoles | End-Fire (180°) | 8 | SIW | 63 × 30 (est.) |
| C. A. Balanis, Antenna Theory: Analysis and Design, 3rd ed. Hoboken, NJ, USA: Wiley, 2005. | 2 × 4 Stacked Patches | Broadside | 8 | Microstrip | 24 × 24 |
| Prabhat Baniya, et al. Switched-Beam End-Fire Planar Array and Integrated Feed Network for 60-GHz Chip-to-Chip Communications | 2 × 2 Circular Patches | End-Fire (360°) | 4 | Microstrip | 17 × 15 |

V. Eight Beams Using Eight-Element Circular Array

Figure 13:
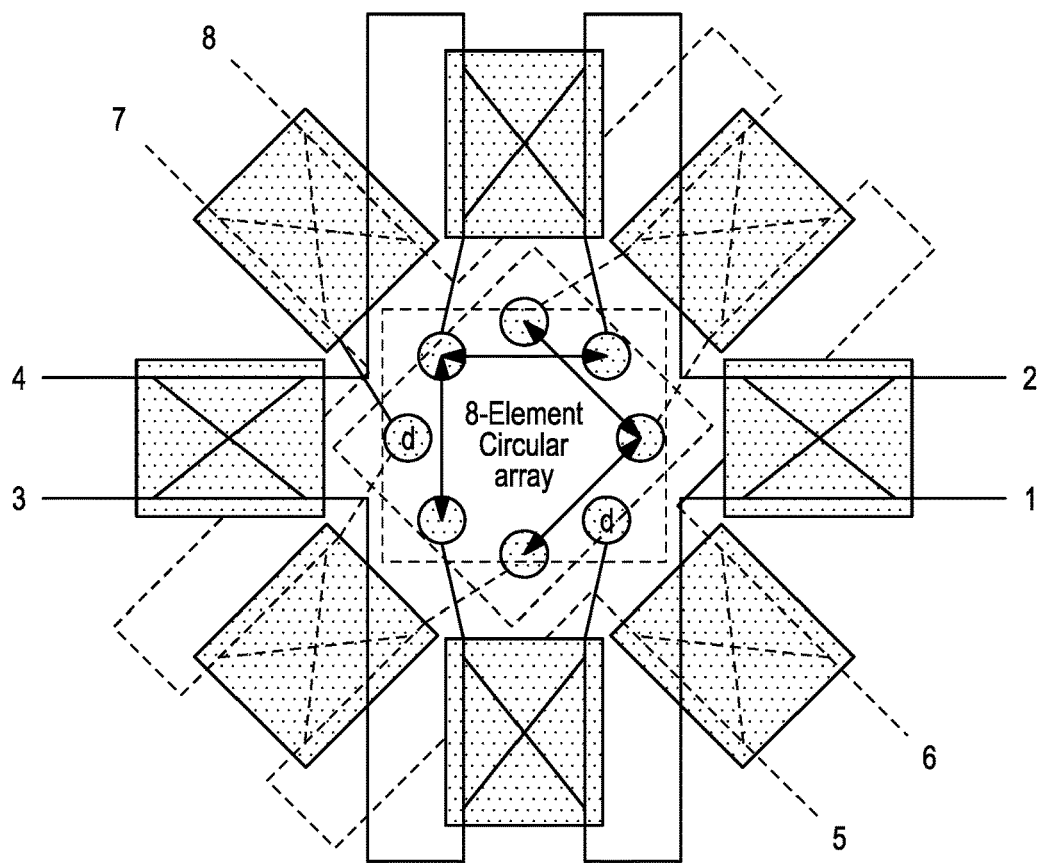
FIG. 13 shows an eight-element circular array fed with the two 2-D Butler matrix.

The beam scanning in all eight directions could be achieved by using an eight-element circular array, as shown in FIG. 13. This array can be thought of as the combination of a 2×2 planar array with another 2×2 planar array that is rotated by 45°. This, however, requires that the elements be small enough to avoid any overlap. Each 2×2 array could be fed by the 2-D Butler matrix described in the paper. The link losses will increase because an additional SP2T switch will be required at the front to switch between the two SP4T switches. The two Butler matrices could be implemented in two different layers to avoid overlap and reduce the area overhead.

VI. CONCLUSION

A compact 2-D Butler matrix for a 60 GHz 2×2 circular patch planar array is designed, integrated and implemented as a multilayer microstrip structure. The matrix enables seamless switching of the array main beam for reconfigurable interchip communication in the MCMC system. The antenna module provides four switchable diagonal beams in the azimuth plane. A hybrid space-surface wave link is also demonstrated for chip-to-chip communications. A systematic integration of the 2-D Butler matrix with the antenna array is performed to create the antenna module. The Butler matrix and the antenna array can be designed independently because they are separated from one another by a common ground plane. At first, the Butler matrix is implemented using microstrip lines and the inter-element phase shifts at the output are verified through full wave simulations. After verifying the operation of the Butler matrix, it is integrated with the circular patch planar array through stacking, thus forming a multilayer antenna module. The feed layer is made accessible so that the antenna module can be interconnected with the chips on the PCB board using surface mounting technology. Before this can be done, the Butler matrix is first augmented with a SP4T control switch at the inputs to electronically cycle through the inter-element phase shifts and scan the main beam. Five antenna modules are put together to form a larger module called the MAM to emulate interchip communication scenario in the MCMC system with the hybrid links. The PCB prototypes of the MAM are fabricated and transmission coefficients are measured between the antenna modules. The measurements agree well with the simulated results. The transmission between the communicating pair of antenna modules is higher than the interfering pairs of antenna modules indicating that the signal levels are higher than the interference levels in the given MCMC scenario. Furthermore, the total transmission is decomposed into space and surface wave components. The surface waves help to improve coupling and transmission bandwidth. The antenna module has the potential to interlink hundreds of cores and realize a MCMC computing unit that is capable of breaking parallel processing barriers.

While the antenna modules described herein has been illustrated for use to establish wireless interchip communication for multichip multicore computing system, they may also be used for establishing wireless interchip communication for chips that have a single core. More generally, the antenna modules may be used in a wide variety of different applications, particularly those that require wireless communication in a single plane. For instance, the antennas may find use in application involving communication between Internet of Things (IoT) devices, machine-to-machine and device-to-device systems, autonomous vehicles and so on. In some of these applications the wireless communication links will generally be substantially greater than the length of the links in a multichip multicore computing system. Accordingly, the operating frequencies of the antenna module may be less than the illustrative 60 GHz operating frequency described above. For instance, some applications may employ an operating frequency of 5 GHz. Of course, the antenna modules may operate at other microwave frequencies as well.

The above examples and disclosure are intended to be illustrative and not exhaustive. These examples and the disclosure will suggest many variations and alternatives to one of ordinary skill in this art. All these alternatives and variations are intended to be included within the scope of the attached claims. Those familiar with the art may recognize other equivalents to the specific embodiments described herein, which equivalents are also intended to be encompassed by the claims attached hereto. For example, while the antenna modules described herein have been described as being implemented with an antenna-in-package (AiP) design, in other embodiments an antenna-on-chip (AoC) implementation may be employed instead. As another example, while the antenna module has been described as a hybrid interconnect that employs both space and surface wave links, in other implementations only a space (i.e., wireless) link may be employed by using antenna modules that are not interconnected with one another. As yet another example, while the embodiments disclosed show either 4 or 8 patch antenna elements being employed, more generally any number of elements may be used. Likewise, in some embodiments the 90° hybrids may be replaced with switches. Furthermore, various implementation details described above for illustrative purposes only, such as the choice of electrical interconnection techniques, the number of antenna elements in the array, the selection of various laminates, component dimensions and so on, are not limited to the particular examples presented herein. For example, electrical interconnection techniques (e.g., wire bonding) other than flip-chip techniques may be employed to electrically interconnect the antenna modules to their respective underlying chips.

What has been described and illustrated herein are embodiments of the invention along with some of their variations. The terms, descriptions and figures used herein are set forth by way of illustration only and are not meant as limitations. Those skilled in the art will recognize that many variations are possible within the spirit and scope of the embodiments of the invention.

The invention claimed is:

1. An antenna module, comprising:
an array of n circular patch antenna elements for 360° end-fire scanning, where n is equal to 4 or a multiple thereof;
a Butler matrix having n/4 submatrices, each of the submatrices including:
two input 90° hybrids each having two outputs and two inputs for selectively receiving signals from a transceiver; and
two output 90° hybrids each having two outputs and two inputs, the two inputs of each output 90° hybrid being coupled to an output of different ones of the input 90° hybrids, each output of the output 90° hybrids being coupled to a different one of the circular patch antenna elements.

2. The antenna module of claim 1, wherein the input and output 90° hybrids are formed as microstrip structures on a first laminate substrate.

3. The antenna module of claim 2, wherein the array of n circular patch antenna elements is disposed on a second laminate substrate bonding a side of the first laminate substrate opposite to a side on which the input and output 90° hybrids are located.

4. The antenna module of claim 3, further comprising a ground plane disposed between the first and second laminate substrates for electrically decoupling the input and output hybrids from the patch antenna elements.

5. The antenna module of claim 3, further comprising vias extending through the first and second laminate substrates for electrically coupling the output hybrids to the patch antenna elements.

6. The antenna module of claim 1, wherein the circular patch antenna elements are configured to resonate at 60 GHz.

7. The antenna module of claim 1, wherein n=4 and the array is a 2×2 array of circular patch antenna elements.

8. The antenna module of claim 1, wherein n=8 and the array is a circular array of circular patch antenna elements.

9. The antenna module of claim 1, wherein the input and output 90° hybrids are formed as stripline or waveguide structures on a first laminate substrate.

10. A multichip system, comprising:
a plurality of processor chips each having at least one processor core;
a plurality of antenna module for establishing interchip wireless communication, each of the antenna modules being disposed on one of the processor chips, the antenna module including:
an array of n circular patch antenna elements for 360° end-fire scanning, where n is equal to 4 or a multiple thereof;
a Butler matrix having n/4 submatrices, each of the submatrices including:
two input 90° hybrids each having two outputs and two inputs for selectively receiving signals from a transceiver; and
two output 90° hybrids each having two outputs and two inputs, the two inputs of each output 90° hybrid being coupled to an output of different ones of the input 90° hybrids, each output of the output 90° hybrids being coupled to a different one of the circular patch antenna elements.

11. The system of claim 10, wherein at least one of the processor chips has a plurality of processor cores.

12. The system of claim 10, wherein the input and output 90° hybrids are formed as microstrip structures on a first laminate substrate.

13. The system of claim 12, wherein the array of n circular patch antenna elements is disposed on a second laminate substrate bonding a side of the first laminate substrate opposite to a side on which the input and output 90° hybrids are located.

14. The system of claim 13, further comprising a ground plane disposed between the first and second laminate substrates for electrically decoupling the input and output hybrids from the patch antenna elements.

15. The system of claim 13, wherein the second laminate substrates of the antenna module are formed from a common laminate structure to define an interconnect layer that extends over all of the processor chips to establish surface wave coupling between the antenna modules.

16. The system of claim 13, further comprising vias extending through the first and second laminate substrates for electrically coupling the output hybrids to the patch antenna elements.

17. The system of claim 10, wherein the circular patch antenna elements are configured to resonate at 60 GHz.

18. The system of claim 10, further comprising:
a plurality of transceivers, each of the transceivers being associated with one of the processor chips; and
a plurality of electrical interconnect arrangements, each of the electrical interconnect arrangements electrically coupling inputs of the Butler matrix of an antenna module to one of the transceivers.

19. The system of claim 18, wherein each transceiver element associated with its respective processor chip is incorporated in its respective processor chip.

20. The system of claim 18, wherein each transceiver element associated with its respective processor chip is located external of its respective processor chip.

21. The system of claim 18, wherein each of the electrical interconnect arrangements includes a single-pole, n-throw switches electrically connecting the inputs of the Butler matrix of an antenna module to one of the transceivers.

22. An antenna module, comprising:
an array of circular patch antenna elements for 360° end-fire scanning;
a Butler matrix having one or more submatrices, each of the submatrices including:
two input 90° hybrids each having two outputs and two inputs for selectively receiving signals from a transceiver; and
two output 90° hybrids each having two outputs and two inputs, the two inputs of each output 90° hybrid being coupled to an output of different ones of the input 90° hybrids, each output of the output 90° hybrids being coupled to a different one of the circular patch antenna elements.

* * * * *